United States Patent
Ohmae et al.

(10) Patent No.: US 8,242,513 B2
(45) Date of Patent: Aug. 14, 2012

(54) METHOD FOR GROWING SEMICONDUCTOR LAYER, METHOD FOR PRODUCING SEMICONDUCTOR LIGHT-EMITTING ELEMENT, SEMICONDUCTOR LIGHT-EMITTING ELEMENT, AND ELECTRONIC DEVICE

(75) Inventors: Akira Ohmae, Kanagawa (JP); Masayuki Arimochi, Kanagawa (JP); Jugo Mitomo, Kanagawa (JP); Noriyuki Futagawa, Kanagawa (JP); Tomonori Hino, Kanagawa (JP)

(73) Assignee: Sony Corporation, Tokyo (JP)

( * ) Notice: Subject to any disclaimer, the term of this patent is extended or adjusted under 35 U.S.C. 154(b) by 673 days.

(21) Appl. No.: 12/121,906

(22) Filed: May 16, 2008

(65) Prior Publication Data

US 2008/0283846 A1 Nov. 20, 2008

(30) Foreign Application Priority Data

May 18, 2007 (JP) .................. 2007-133340

(51) Int. Cl.
*H01L 33/16* (2010.01)
(52) U.S. Cl. .................. 257/79; 257/103; 257/E33.003; 257/E33.023; 438/22; 438/46
(58) Field of Classification Search .......... 257/79, 257/94, 103, E33.003, E33.005, E33.023; 438/46, 47, 483, 44, 22
See application file for complete search history.

(56) References Cited

U.S. PATENT DOCUMENTS

| 5,006,908 | A | 4/1991 | Matsuoka et al. |
| 5,218,216 | A | 6/1993 | Manabe et al. |
| 6,229,151 | B1 | 5/2001 | Takeuchi et al. |
| 6,569,704 | B1 | 5/2003 | Takeuchi et al. |
| 6,849,472 | B2 | 2/2005 | Krames et al. |
| 2003/0045102 | A1 | 3/2003 | Nagasawa et al. |
| 2005/0247260 | A1* | 11/2005 | Shin et al. ............... 117/88 |
| 2005/0285136 | A1 | 12/2005 | Ou et al. |
| 2007/0093073 | A1* | 4/2007 | Farrell et al. .......... 438/763 |
| 2007/0164292 | A1* | 7/2007 | Okuyama ............... 257/79 |

FOREIGN PATENT DOCUMENTS

| EP | 0993048 | 4/2000 |
| EP | 1593760 | 11/2005 |
| JP | 56-059699 | 5/1981 |
| JP | 63-188938 | 8/1988 |
| JP | 02-211620 | 8/1990 |
| JP | 02-291147 | 11/1990 |
| JP | 04-299876 | 10/1992 |
| JP | 06-029574 | 2/1994 |
| JP | 07-131068 | 5/1995 |
| JP | 11-112029 | 4/1999 |

(Continued)

OTHER PUBLICATIONS

European Search Report corresponding to European Serial No. 08008617.6 dated Apr. 14, 2010.

(Continued)

*Primary Examiner* — Matthew W Such
*Assistant Examiner* — Scott Stowe
(74) *Attorney, Agent, or Firm* — SNR Denton US LLP

(57) ABSTRACT

Disclosed herein is a method for growing a semiconductor layer which includes the step of growing a semiconductor layer of hexagonal crystal structure having the (11-22) or (10-13) plane direction on the (1-100) plane of a substrate of hexagonal crystal structure.

9 Claims, 29 Drawing Sheets

FOREIGN PATENT DOCUMENTS

| TW | 237903 | 8/2005 |
| WO | WO2004061909 | 7/2004 |
| WO | 2006/099138 | 9/2006 |
| WO | WO2006099138 | 9/2006 |
| WO | WO2006130696 | 12/2006 |

OTHER PUBLICATIONS

Hwang, S. H. et al., "Heteroepitaxy of Gallium Nitride on (0001), (1012) and (1010) Sapphire Surfaces", Journal of Crystal Growth Netherlands, vol. 142, No. 1-2-, Sep. 1994, pp. 5-14.

Ni, X., et al., "Epitaxial Lateral Overgrowth of (11-22) Semipolar GaN on (1-100) m-plane Sapphire by Metalorganic Chemical Vapor Deposition", Applied Physics Letters, AIP, American Institute of Physics, vol. 90, No. 18, May 2, 2007, pp. 1-3.

Bourgrioua, Z. et al., "Reduction of Stacking Faults in (1120) and (1122) GaN Films by ELO Techniques and Benefit on GaN Wells Emission", Physical Status Solida Wiley—VcH Germany, vol. 204, No. 1., Jan. 2007, pp. 282-289.

Baker, T. J. et al., "Characterization of Planar Semipolar Gallium Nitride Films on Sapphire Substrates", Japanese Journal of Applied Physics, vol. 45, No. 6, Feb. 2006; pp. L154-L157.

Japanese Office Action issued on Jun. 2, 2009 in connection with JP Application No. 2007-133340.

* cited by examiner

±30° OFF TOWARD A-AXIS
FROM R-PLANE

±90° OFF TOWARD A-AXIS
FROM R-PLANE

METHOD FOR GROWING SEMICONDUCTOR LAYER, METHOD FOR PRODUCING SEMICONDUCTOR LIGHT-EMITTING ELEMENT, SEMICONDUCTOR LIGHT-EMITTING ELEMENT, AND ELECTRONIC DEVICE

CROSS REFERENCES TO RELATED APPLICATIONS

The present invention contains subject matter related to Japanese Patent Application JP 2007-133340 filed in the Japan Patent Office on May 18, 2007, the entire contents of which being incorporated herein by reference.

BACKGROUND OF THE INVENTION

1. Field of the Invention

The present invention relates to a method for growing semiconductor layers, a method for producing a semiconductor light-emitting element, a semiconductor light-emitting element, and an electronic device. More particularly, the present invention relates to a III-V nitride compound semiconductor light-emitting diode and a variety of apparatus and equipment provided with the light-emitting diode.

2. Description of the Related Art

The existing method for producing a light-emitting diode based on a GaN semiconductor is mostly by growing an n-type layer, an active layer, and a GaN semiconductor layer including a layer on the (0001) plane (or C-plane) of a sapphire substrate by the MOCVD process (Metal Organic Chemical Vapor Deposition), with orientation in the C axis.

Unfortunately, when grown on the (0001) plane (or C-plane) of a sapphire substrate, the pseudomorphic quantum well layer of InGaN oriented in the C axis suffers the disadvantage that a large piezoelectric field occurs in the direction perpendicular to the well plane (or the C axis direction), thereby spatially separating electrons and holes from each other and reducing the probability of electron-hole recombination (which is known as the quantum confined Stark effect). The result is a decrease in internal quantum efficiency in a light-emitting diode based on InGaN/GaN, which in turn leads to a decrease in external quantum efficiency. This is one cause to impede improvement in the light-emitting output.

One way to suppress the quantum confined Stark effect in the active layer is to grow a GaN semiconductor layer with the (11-20) plane (or A-plane) on a sapphire substrate with the (1-102) plane (or R-plane). Unfortunately, the GaN semiconductor layer with the (11-20) plane has many threading dislocations which deteriorate its crystal quality.

There has been proposed in Japanese Patent Laid-Open No. Hei 11-112029 (hereinafter referred to as Patent Document 1) a method for suppressing the quantum confined Stark effect in a semiconductor light-emitting element which is produced by growing a plurality of GaN semiconductor layers including a pseudomorphic quantum well layer. According to the proposed method, the pseudomorphic quantum well layer is grown in a plane direction differing from that in which the piezoelectric field is maximum. In the case where the GaN semiconductor layer has the wurtzite crystal structure, such a plane direction is oblique more than 1° (say, 40°, 90°, or 140°) from the [0001] direction. A semiconductor light-emitting element produced by the foregoing method is shown in FIG. 39. It includes a substrate 101 of SiC or GaN, a buffer layer (not shown) of AlN, a contact layer 102 of n-type GaN, a cladding layer 103 of n-type AlGaN, a multiple quantum well layer 104 of GaInN/GaN or GaInN/GaInN, a cladding layer 105 of p-type AlGaN, and a contact layer 106 of p-type GaN, which are sequentially grown one over the other. The contact layer 102 and the cladding layer 103 are grown in the {0001} plane direction. The multiple quantum well layer 104 is grown on the {2-1-14} plane or {01-12} plane which has been formed by selective growing or selecting etching on the cladding layer 103. The 104a and 104b planes on which the multiple quantum well layer 104 is grown coincide with the {2-1-14} plane or {01-12} plane. The cladding layer 105 and the contact layer 106 change in crystal structure as they grow, with their plane direction switched from that of the multiple quantum well layer 104 to the {0001} plane direction. Incidentally, the reference numerals 107 and 108 denote a p-side electrode and an n-side electrode, respectively.

The existing semiconductor light-emitting element as shown in FIG. 39 permits the multiple quantum well layer 104 as an active layer to decrease in piezoelectric field; however, it suffers the disadvantage that it is not typically easy in practice to grow under good control the multiple quantum well layer 104 with the oblique facet of the {2-1-14} plane or {01-12} plane. Therefore, it presents difficulties in its efficient production.

The present invention was completed to address the foregoing problems. Thus it is an aim of the present invention to provide a method for growing semiconductor layers on a substrate such that the plane direction or the growing plane facet can be selected as desired, or the semiconductor layers can be made to decrease in piezoelectric field and to improve in crystal quality according to need.

It is another aim of the present invention to provide an easy-to-produce semiconductor light-emitting element and a method for producing the same. This aim is achieved by employing the above-mentioned method for growing semiconductor layers at the time of growing the semiconductor layers to form the light-emitting element structure. The resulting semiconductor light-emitting element is identified by good crystal quality of semiconductor layers and reduced quantum confined Stark effect in active layers.

It is further another aim of the present invention to provide a high-performance electronic device equipped with outstanding semiconductor light-emitting elements as mentioned above.

SUMMARY OF THE INVENTION

The first mode of the present invention is directed to a method for growing a semiconductor layer which includes growing a semiconductor layer of hexagonal crystal structure having the (11-22) or (10-13) plane direction on the (1-100) plane of a substrate of hexagonal crystal structure.

The method according to the first mode of the present invention is carried out typically in such a way that the semiconductor layer grows with the facets of the (11-20) plane, the (0001) plane, and the (11-22) plane facing outward, or with the facets of the (1-100) plane, the (0001) plane, and the (10-13) plane facing outward.

The semiconductor is formed from a semiconductor layer of hexagonal crystal structure, typically one which has the wurtzite crystal structure. Examples of the semiconductor having the wurtzite crystal structure include III-V nitride compound semiconductors, oxide semiconductors, and α-ZnS (not restrictive).

The III-V nitride compound semiconductors is represented commonly by $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$, $0 \leq x+y+z<1$, and $0 \leq u+v<1$).

It is represented more specifically by $Al_xB_yGa_{1-x-y-z}In_zN$ (where $0 \leq x \leq 1$, $0 \leq y \leq 1$, $0 \leq z \leq 1$, and $0 \leq x+y+z<1$).

It is represented typically by $Al_xGa_{1-x-z}In_zN$ (where $0 \leq x \leq 1$, and $0 \leq z \leq 1$).

Its typical examples include GaN, InN, AlN, AlGaN, InGaN, and AlGaInN. The III-V nitride compound semiconductor (e.g., GaN) has its dislocations bent when it is doped with B or Cr. Therefore, it may be BGaN, GaN:B (B-doped GaN), or GaN:Cr (Cr-doped GaN).

Preferred example of the III-V nitride compound semiconductor include GaN, $In_xGa_{1-x}N$ ($0<x<0.5$), $Al_xGa_{1-x}N$ ($0<x<0.5$), and $Al_xIn_yGa_{1-x-y}N$ ($0<x<0.5$, $0<y<0.2$).

The so-called low-temperature buffer layer to be grown first on the substrate is usually a GaN buffer layer, AlN buffer layer, or AlGaN buffer layer, with or without Cr doping. It also includes a CrN buffer layer.

Examples of the oxide semiconductor include titanium (IV) oxide ($TiO_2$), vanadium (V) oxide ($V_2O_5$), chromium (III) oxide ($Cr_2O_3$), manganese (II) oxide (MnO), iron (III) oxide ($Fe_2O_3$), tricobalt (II) tetraoxide ($Co_3O_4$), nickel (II) oxide (NiO), copper (I) oxide ($Cu_2O$), zinc (II) oxide (ZnO), tin (IV) oxide ($SnO_2$), gallium (III) oxide ($Ga_2O_3$), indium (III) oxide ($In_2O_3$), bismuth (III) oxide ($Bi_2O_3$), strontium (II) oxide (SrO), strontium titanate ($SrTiO_3$), barium titanate ($BaTiO_3$), and yttrium oxide ($Y_2O_3$). An additional example is oxychalcogenide LnCuOOCh (Ln=La, Ce, Nd, Pr; Ch=S, Se, Te), such as CuAlO and $SrCu_2O_2$. They are not restrictive.

The semiconductor layer may be grown by any epitaxial method, such as metal organic chemical vapor deposition (MOCVD), hydride vapor phase epitaxy, halide vapor phase epitaxy growth (HVPE), and molecular beam epitaxy (MBE). Adequate one of them is selected according to need.

Examples of the substrate of hexagonal crystal structure include sapphire, SiC (including 6H and 4H), α-ZnS, and ZnO. Substrates of III-V nitride compound semiconductor (such as GaN, AlGaInN, AlN, and GaInN) may also be used. An alternative substrate may be a substance of hexagonal crystal structure which has been grown on a substrate differing from the substance of hexagonal crystal structure.

The substrate may be one whose one principal plane is the (1-100) plane or one which has at least one hollow part (groove) (typically a plurality of hollow parts (grooves)) on the principal plane such that one side of the hollow part is the (1-100) plane.

The substrate whose one principal plane is the (1-100) plane should preferably have more than one raised part which is formed thereon from a material different from or identical with the substrate. In this case, the semiconductor layer begins to grow from the bottom of the hollow part between the raised parts. Typically, the raised parts and the hollow parts are formed periodically and alternately on the substrate. The intervals of the raised parts and hollow parts are 3 to 5 μm (not restrictive). The raised parts and hollow parts should be formed such that the ratio of their bases is 0.5 to 3 (not restrictive). The height of the raised part from the substrate should be greater than 0.3 μm, preferably greater than 1 μm (not restrictive). The raised part should have a side oblique to the principal plane of the substrate (for example, a side which is in contact with one principal plane of the substrate). The angle (θ) between the side and the principal plane of the substrate should be $120°<θ<150°$, preferably 140°, from the standpoint of efficient light emission (not restrictive). The raised part may have any cross section, such as triangle, square, pentagon, hexagon, circle, and ellipse, and it may also have a flat or curved side. Of these cross sections, a triangle (with or without its apex truncated or rounded) is desirable. The hollow part may also have any cross section, such as triangle, square, pentagon, hexagon, circle, and ellipse. Of these cross sections, an inverted trapezoid is desirable from the standpoint of efficient light emission. The inverted trapezoid ss that of accurate shape as well as approximate shape (the same shall apply hereinafter). The height of the raised part (or the depth of the hollow part), which is denoted by d, should be 0.5 μm<d<5 μm, typically 1.0±0.2 μm (not restrictive). The raised parts with an excessively large value of d prevent sufficient supply of raw material gas to the hollow parts, thereby hampering the growth of the semiconductor layer from the bottom of the hollow part. Conversely, the raised parts with an excessively small value of d cause the semiconductor layer to grow not only from the bottom of the hollow part but also from the side of the raised part. The width ($W_g$) of the hollow part is 0.5 to 5 μm, typically 2±0.5 μm (not restrictive). The width ($W_t$) of the raised part with a trapezoidal cross section is 1 to 1000 μm, typically 4±2 μm (not restrictive).

The raised parts and the hollow parts may extend straight in one direction in parallel to each other on the substrate. Alternatively, they may extend straight in different directions on the substrate so that they form two-dimensional patterns, such as polygons (triangle, square, pentagon, hexagon, etc., with or without their apexes truncated), circle, ellipse, and dot. A preferred example is a honeycomb pattern composed of hexagons, each side being the raised part surrounded by the hollow part. This structure permits the active layer to emanate light in all directions (360°). Another preferred example is a honeycomb pattern composed of hexagons, each side being the hollow part surrounded by the raised part. In this case, the raised part may be a triangular pyramid, square pyramid, pentagonal pyramid, hexagonal pyramid, cone, elliptic cone, etc. (with or without their apexes truncated or rounded).

The raised part may be formed any material, conductive or non-conductive, such as dielectric material of oxide, nitride, and carbide, and conductive material (including transparent one) of metal and alloy. The oxides include silicon oxide ($SiO_x$), titanium oxide ($TiO_x$), and tantalum oxide ($TaO_x$). They may be used in combination with one another in the form of laminate film. The nitrides include silicon nitride ($SiN_x$, including $Si_3N_4$), SiON, CrN, and CrNO. They may be used in combination with one another in the form of laminate film. The carbides include SiC, HfC, ZrC, WC, TiC, and CrC. They may be used in combination with one another in the form of laminate film. The metals and alloys include B, Al, Ga, In, W, Ni, Co, Pd, Pt, Ag, AgNi, AgPd, AuNi, and AuPd. They may be used in combination with one another in the form of laminate film. The transparent conducting materials include ITO (indium-tin compound oxide), IZO (indium-zinc compound oxide), ZO (zinc oxide), FTO (fluorine-doped tin oxide) and tin oxide. They may be used in combination with one another in the form of laminate film. Moreover, the foregoing materials may be used in combination with one another in the form of laminate film. Alternatively, the nitride, oxide, or carbide may be formed by forming the raised part from metal and then nitriding, oxidizing, or carbonizing at least the surface thereof.

The second mode of the present invention is directed to a method for growing a semiconductor layer which includes growing on the (1-102) plane of a substrate of hexagonal crystal structure a semiconductor layer of hexagonal crystal structure having the (11-20) plane direction such that at least one facet faces outward which is selected from those of the (11-22) plane, (0001) plane, (000-1) plane, (33-62) plane, and (1-100) plane.

According to the second mode of the present invention, a semiconductor layer is grown while forming the (11-22)

plane facet, (0001) plane facet, and (000-1) plane facet, or while forming the (11-22) plane facet, (1-100) plane facet, and (33-62) plane facet, or while forming the (1-100) plane facet, or while forming the (1-100) plane facet and (11-20) plane facet.

What is mentioned above about the first mode of the present invention is applicable to the second mode of the present invention except for restrictions mentioned above.

The third mode of the present invention is directed to a method for producing a semiconductor light-emitting element which includes growing a semiconductor layer of hexagonal crystal structure having the (11-22) or (10-13) plane direction on the (1-100) plane of a substrate of hexagonal crystal structure.

The semiconductor light-emitting element is constructed of semiconductor layers including an n-type layer, an active layer, and a p-type layer. Typically, all the semiconductor layers, including the active layer, are those of hexagonal crystal structure. The semiconductor light-emitting element is a light-emitting diode or a semiconductor laser.

The substrate may be left attached to or removed from the eventually formed semiconductor light-emitting element.

What is mentioned above about the first mode of the present invention is applicable to the third mode of the present invention except for restrictions mentioned above.

The fourth mode of the present invention is directed to a method for producing a semiconductor light-emitting element which includes growing on the (1-102) plane of a substrate of hexagonal crystal structure a semiconductor layer of hexagonal crystal structure having the (11-20) plane direction such that at least one facet faces outward which is selected from those of the (11-22) plane, (0001) plane, (000-1) plane, (33-62) plane, and (1-100) plane.

What is mentioned above about the first mode of the present invention is applicable to the fourth mode of the present invention except for restrictions mentioned above.

The fifth mode of the present invention is directed to a semiconductor light-emitting element which includes a substrate of hexagonal crystal structure and a semiconductor layer grown on the (1-100) plane thereof which has the (11-22) or (10-13) plane direction.

The sixth mode of the present invention is directed to a semiconductor light-emitting element which includes a semiconductor layer which is formed from a semiconductor of hexagonal crystal structure and has the (11-22) or (10-13) plane direction.

The seventh mode of the present invention is directed to an electronic device having one or more semiconductor light-emitting elements wherein at least one of the semiconductor light-emitting elements is composed of a substrate of hexagonal crystal structure and a semiconductor layer of hexagonal crystal structure grown on the (1-100) plane thereof which has the (11-22) or (10-13) plane direction.

The eighth mode of the present invention is directed to an electronic device having one or more semiconductor light-emitting elements wherein at least one of the semiconductor light-emitting elements is a semiconductor layer of hexagonal crystal structure which has the (11-22) or (10-13) plane direction.

What is mentioned above about the first and third modes of the present invention is applicable to the fifth to eighth modes of the present invention except for restrictions mentioned above.

The electronic device is exemplified by LED backlight (for liquid crystal display), LED illuminator, LED display, LED projector, LED rear projection TV, and grating light valve (GLV). It broadly includes those (either portable and stationary) which have at least one semiconductor light-emitting element for display, illumination, optical communications, and light transmission. Typical examples are portable telephones, mobile machines, robots, personal computers, on-vehicle equipment, home electric appliances, LED optical communications equipment, LED light transmission equipment, and portable security equipment (such as electronic key).

The electronic device also includes those which are composed of semiconductor light-emitting elements capable of emitting more than one kind of light differing in waveband, such as far infrared, infrared, red, yellow, green, blue, violet, and ultraviolet. LED illuminators with more than one kind of LED capable of emitting visible light differing in waveband, such as red, yellow, green, blue, and violet, produce natural light or white light composed of such visible lights.

The semiconductor light-emitting element that emits at least one waveband of blue, violet, and ultraviolet can be used as a light source to excite a phosphor which produces natural light or white light.

The LEDs capable of emitting visible light of different wavebands may be combined into a unit and a plurality of such units may be arranged (two-dimensionally for an array or linearly for one or more lines) on a substrate or frame. The unit may be referred to as cell unit, quartet unit, or cluster unit (which contains an undefined number of LEDs but consists of a plurality of LEDs emitting identical or different wavebands). To be specific, the unit consists of three LEDs (one each for red, green, and blue), four LEDs (one for red, two for green, and one for blue), or five or more LEDs.

The semiconductor light-emitting element according to the fifth or sixth mode of the present invention may be used as at least one of the semiconductor light-emitting elements for red, green, and blue light for the backlight, illuminator, display, or light-source cell unit to be arranged on a substrate. The semiconductor of AlGaInP may be used as the light-emitting element for red light.

The semiconductor light-emitting element and the method for production thereof according to the third to sixth modes of the present invention may be applicable to semiconductor elements in general, such as ordinary LED, inter-subband transition light emitting type (quantum cascade type) LED, ordinary semiconductor laser, and inter-subband transition light emitting type (quantum cascade type) semiconductor laser. Additional examples other than light-emitting elements are electron transit elements, such as photodiode (photodetector and sensor), solar cell, and transistors including high electron mobility transistor typified by field effect transistor (FET) and bipolar transistor typified by heterojunction bipolar transistor (HBT).

The present invention mentioned above offers the following advantages. If the substrate has the (1-100) plane, the semiconductor layer can be grown in the (11-12) or (10-13) plane direction. If the substrate has the (1-102) plane, the semiconductor layer can be grown in the (11-20) plane direction, with at least one facet facing outward which is selected from those of the (11-22) plane, (0001) plane, (000-1) plane, (33-62) plane, and (1-100) plane. The semiconductor layer with the adequately selected plane direction and growth plane facet has a suppressed piezoelectric field and an improved crystal quality. In addition, the semiconductor layer can be grown easily under adequately established conditions.

EFFECT OF THE INVENTION

According to the present embodiment, the semiconductor layer can be grown on a substrate in a desired plane direction with a desired growth plane facet, and the resulting semiconductor layer has a suppressed piezoelectric field and an improved crystal quality. The method for growing the semiconductor layer can be applied to the growth of the semiconductor layers as the constituents of the light-emitting element, and the resulting semiconductor layer has an improved crystal quality and a suppressed quantum confined Stark effect in the active layer. The semiconductor light-emitting element can be produced more easily than that disclosed in Patent Document 1. The high-performance semiconductor element can be used to realize a variety of electronic equipment such as high-performance backlight, illuminator, and display.

DETAILED DESCRIPTION OF THE PREFERRED EMBODIMENTS

In what follows, the embodiments of the present invention are described in more detail with reference to the accompanying drawings, in which identical or corresponding parts are designated by the same symbols.

Figure 1:
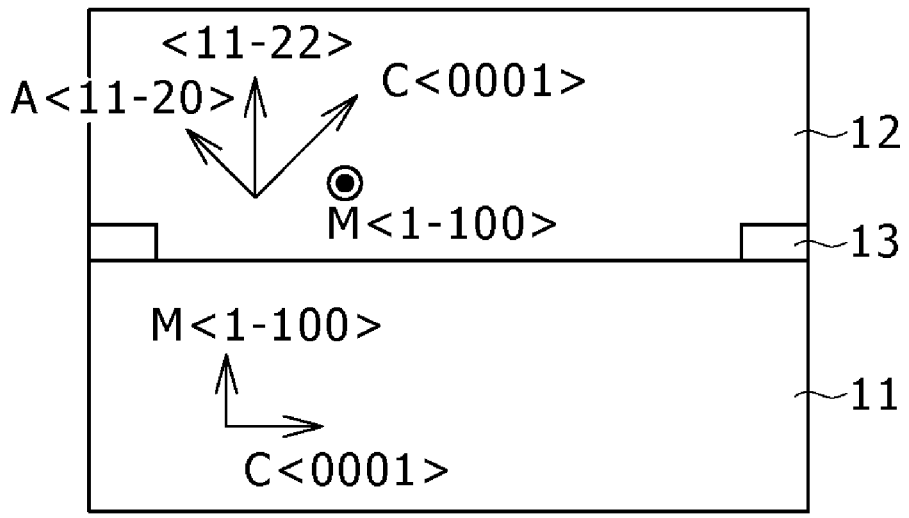
FIG. 1 is a schematic diagram illustrating the method for growing the III-V nitride compound semiconductor layer according to the first embodiment of the present invention.

The first embodiment of the present invention, which is illustrated in FIG. 1, is concerned with a basic method for growing a III-V nitride compound semiconductor layer.

According to the first embodiment, the sapphire substrate 11, whose principal plane is the (1-100) plane (or M-plane), permits the growth thereon of the III-V nitride compound semiconductor layer 12 having the (11-22) plane direction. The sapphire substrate 11 has the raised parts 13 extending straight in one direction, which have been previously formed thereon from $SiO_2$ or SiN. The sapphire substrate 11 and the III-V nitride compound semiconductor layer 12 have the crystal orientation indicated in FIG. 1. The III-V nitride compound semiconductor layer 12 may be grown by the MOCVD process, for example.

Figure 2:
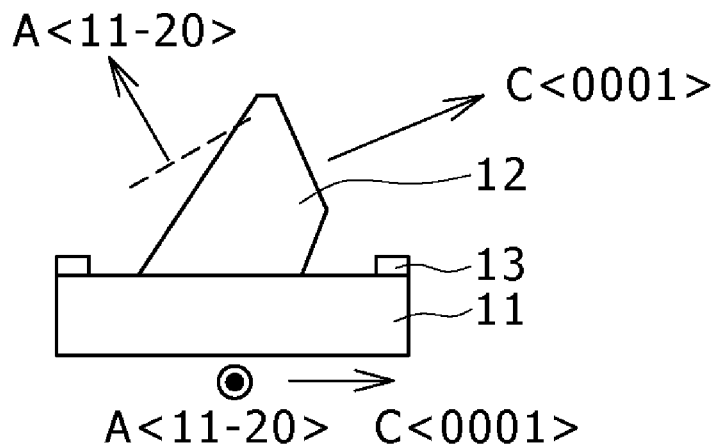
FIG. 2 is a schematic diagram illustrating the method for growing the III-V nitride compound semiconductor layer according to the first embodiment of the present invention.

The III-V nitride compound semiconductor layer 12 in its initial stage of growth is shown in FIG. 2. It grows with its facets orienting in the (11-20) plane (or A-plane), the (0001) plane (or C-plane), and the (11-22) plane. In this case, its growth in the direction of C axis is limited.

The III-V nitride compound semiconductor layer 12 is grown under the following conditions.
Growth rate: 0.5 to 8 μm/h
Flow rate of trimethylgallium $(CH_3)_3Ga$, TMG, or trimethylindium $(CH_3)_3In$, TMI, as the source of III group element:
10 to 90 sccm
Flow rate of $NH_3$ as the source of nitrogen: 5 to 30 slm
Growth temperature: 950 to 1250° C.
Ratio of V/III in source for growth: 1000 to 15000
Growth pressure: 0.01 to 1 atm.

Figure 3:
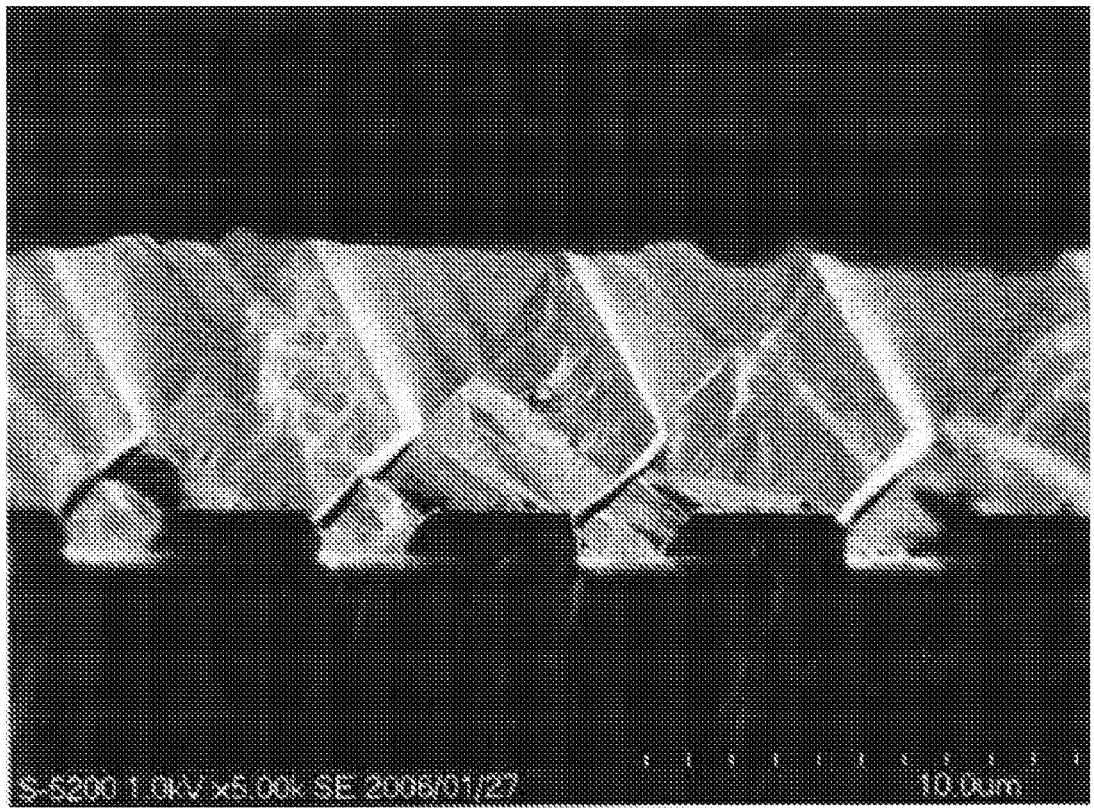
FIG. 3 is an electron micrograph showing a sample of GaN layer which has been grown by the method for growing the III-V nitride compound semiconductor layer according to the first embodiment of the present invention.
Figure 4A:
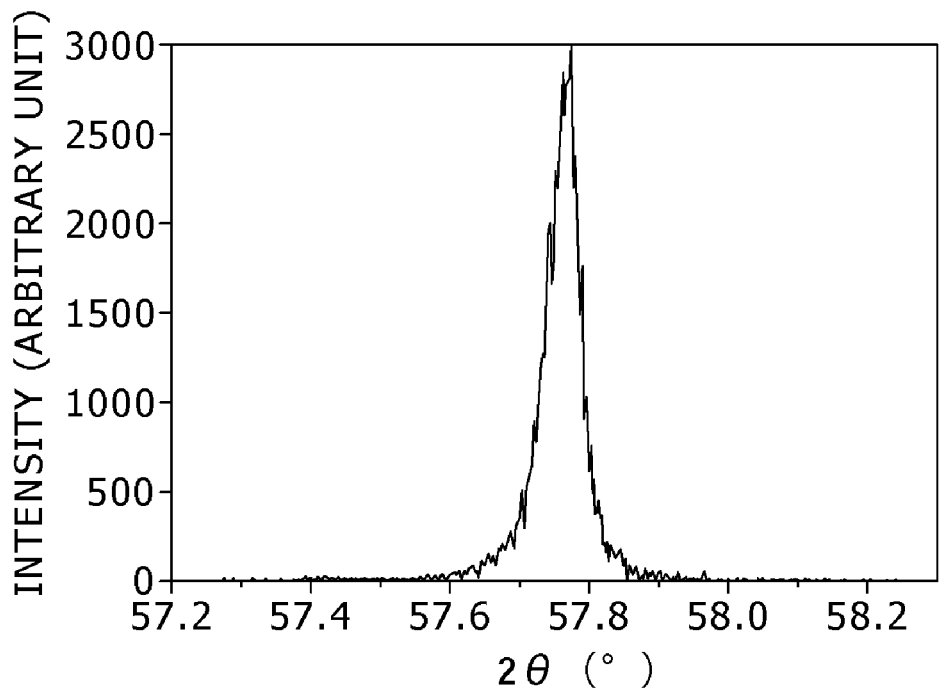
FIGS. 4A to 4B are schematic diagrams showing the result of X-ray diffractometry performed on a GaN layer which has been grown by the method for growing the III-V nitride compound semiconductor layer according to the first embodiment of the present invention.
Figure 4B:
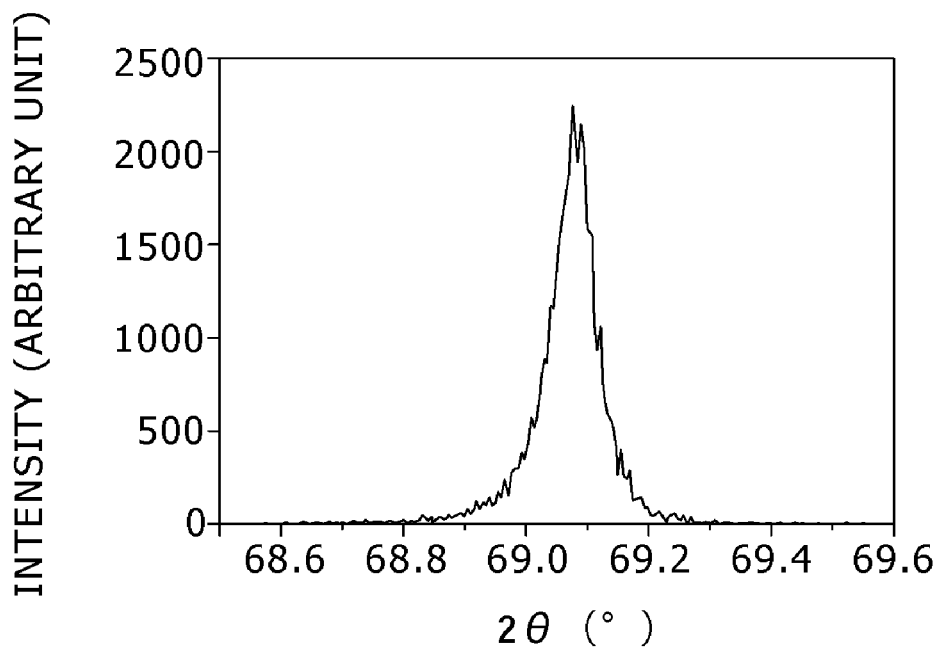

FIG. 3 is a cross-sectional transmission electron micrograph showing a sample composed of a sapphire substrate 11 and a GaN layer grown thereon by the MOCVD process, the GaN layer functioning as the III-V nitride compound semiconductor layer 12. The GaN layer is a continuous film which has resulted from growth via the stage shown in FIG. 2. The sample with the GaN layer grown to the stage shown in FIG. 3 was examined by X-ray diffractometry. The GaN layer gave diffraction peaks due to the (11-20) plane (or A-plane) and the (11-22) plane as shown in FIGS. 4A and 4B, respectively.

Figure 5:
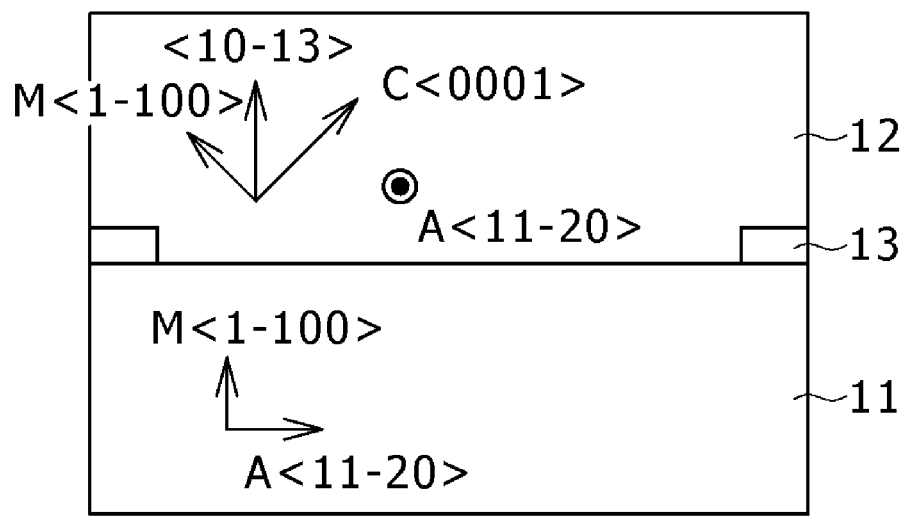
FIG. 5 is a schematic diagram illustrating the method for growing the III-V nitride compound semiconductor layer according to the second embodiment of the present invention.

The second embodiment of the present invention, which is illustrated in FIG. 5, is concerned with a basic method for growing a III-V nitride compound semiconductor layer.

According to the second embodiment, the sapphire substrate 11, whose principal plane is the (1-100) plane (or M-plane), permits the growth thereon of the III-V nitride compound semiconductor layer 12 having the (10-13) plane direction. The sapphire substrate 11 has the raised parts 13 in the same way as in the first embodiment. The sapphire substrate 11 and the III-V nitride compound semiconductor layer 12 have the crystal orientation indicated in FIG. 5. The III-V nitride compound semiconductor layer 12 may be grown by the MOCVD process, for example.

Figure 6:
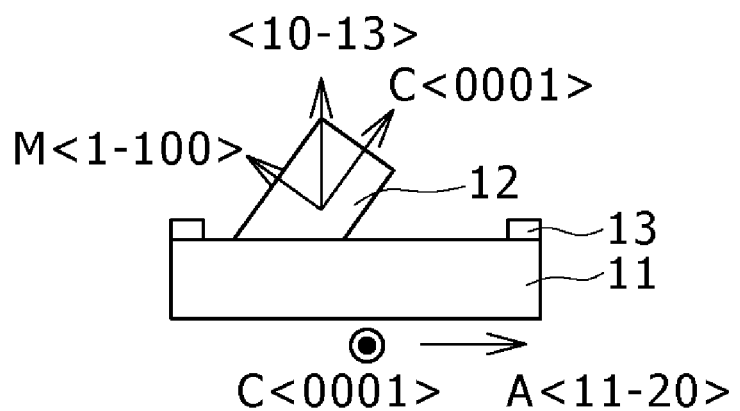
FIG. 6 is a schematic diagram illustrating the method for growing the III-V nitride compound semiconductor layer according to the second embodiment of the present invention.

The III-V nitride compound semiconductor layer 12 in its initial stage of growth is shown in FIG. 6. It grows with its facets facing outward from the (1-100) plane (or M-plane), the (0001) plane (or C-plane), and the (10-13) plane. In this case, its growth in the direction of A axis is limited.

The III-V nitride compound semiconductor layer 12 is grown under the following conditions.
Growth rate: 0.5 to 8 μm/h
Flow rate of TMG or TMI as the source of III group element:
10 to 90 sccm
Flow rate of $NH_3$ as the source of nitrogen: 5 to 30 slm
Growth temperature: 950 to 1250° C.
Ratio of V/III in source for growth: 1000 to 15000
Growth pressure: 0.01 to 1 atm.

Figure 7:
FIG. 7 is an electron micrograph showing a sample of GaN layer which has been grown by the method for growing the III-V nitride compound semiconductor layer according to the first embodiment of the present invention.
Figure 8A:
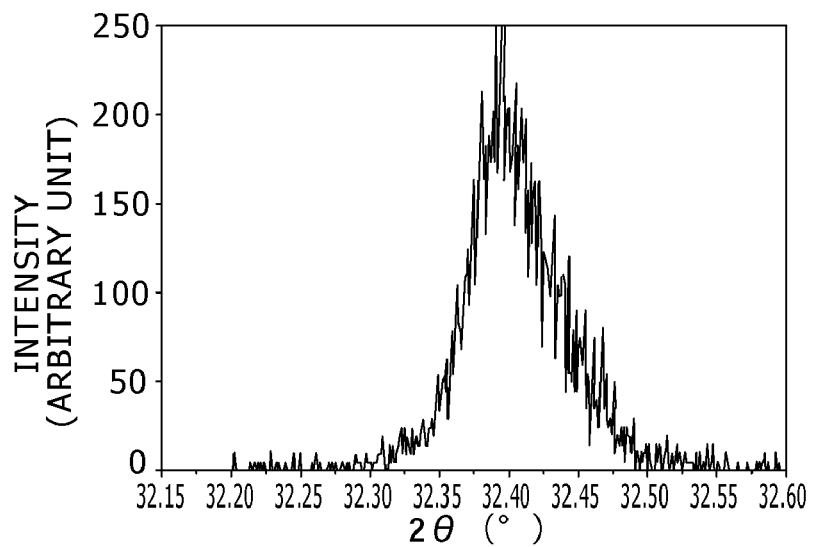
FIGS. 8A to 8C are schematic diagrams showing the result of X-ray diffractometry performed on a GaN layer which has been grown by the method for growing the III-V nitride compound semiconductor layer according to the first embodiment of the present invention.
Figure 8B:
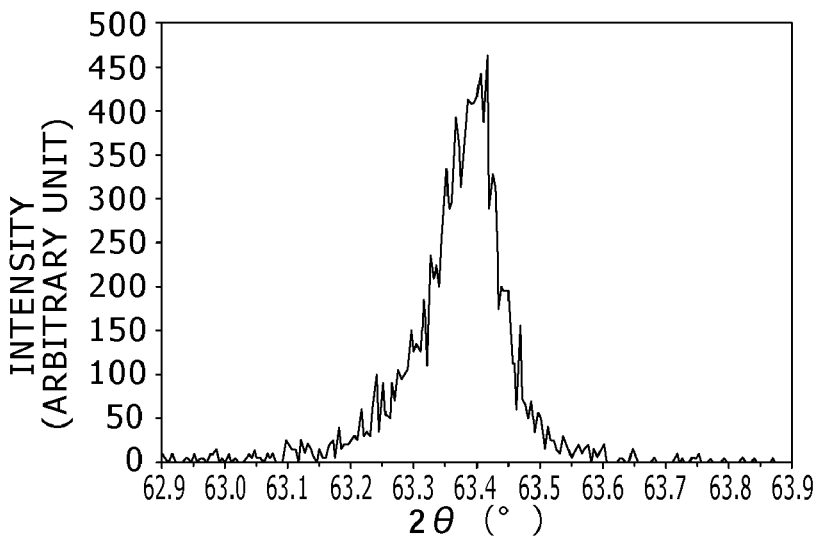
Figure 8C:
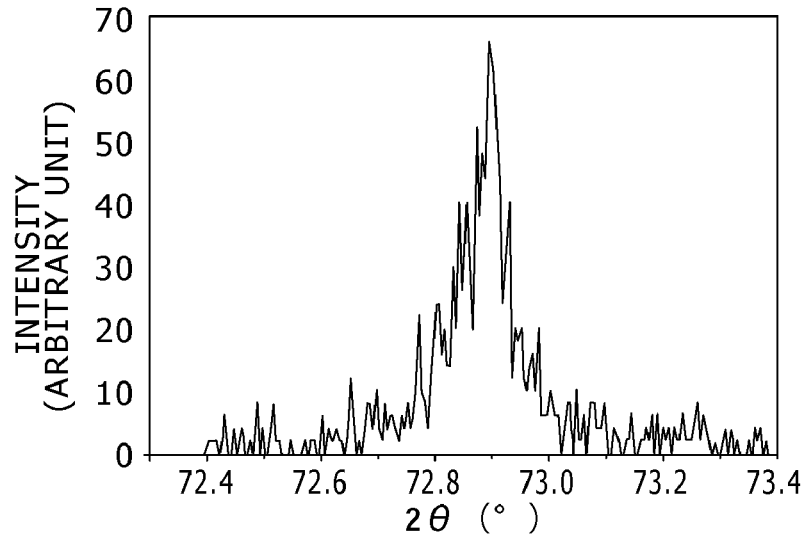

FIG. 7 is a cross-sectional transmission electron micrograph showing a sample composed of a sapphire substrate 11 and a GaN layer grown thereon by the MOCVD process, the GaN layer functioning as the III-V nitride compound semiconductor layer 12. The sample with the GaN layer grown to the stage shown in FIG. 6 was examined by X-ray diffractometry. The GaN layer gave diffraction peaks due to the (1-100) plane, the (10-13) plane, and the (0001) plane (or C-plane) as shown in FIGS. 8A, 8B, and 8C, respectively.

Figure 9:
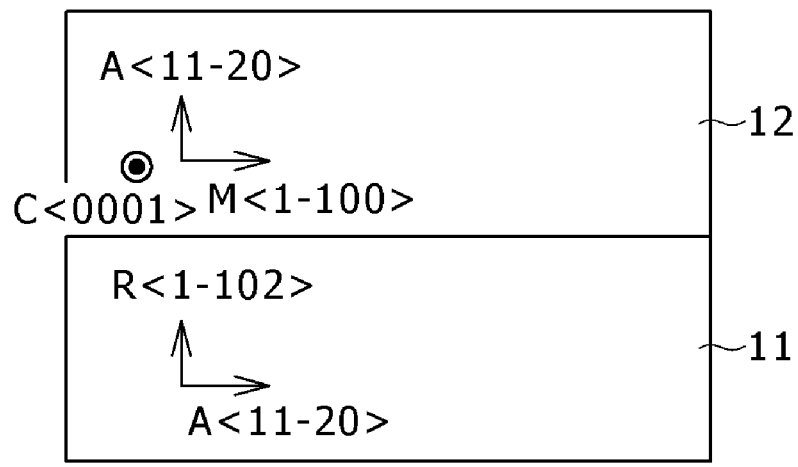
FIG. 9 is a schematic diagram illustrating the method for growing the III-V nitride compound semiconductor layer according to the third embodiment of the present invention.

The third embodiment of the present invention, which is illustrated in FIG. 9, is concerned with a basic method for growing a III-V nitride compound semiconductor layer.

According to the third embodiment, the sapphire substrate 11, whose principal plane is the (1-102) plane (or R-plane), permits the growth thereon of the III-V nitride compound semiconductor layer 12 having the (11-20) plane direction. The sapphire substrate 11 has the raised parts 13 in the same way as in the first embodiment. The sapphire substrate 11 and the III-V nitride compound semiconductor layer 12 have the crystal orientation indicated in FIG. 9. The III-V nitride compound semiconductor layer 12 may be grown by the MOCVD process, for example.

Figure 10:
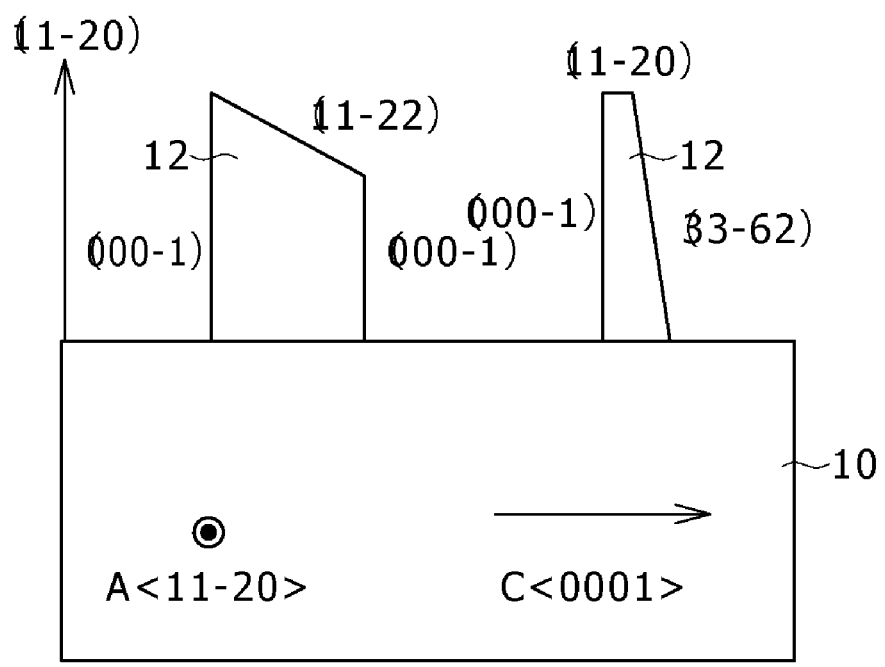
FIG. 10 is a schematic diagram illustrating the method for growing the III-V nitride compound semiconductor layer according to the third embodiment of the present invention.

The III-V nitride compound semiconductor layer 12 in its initial stage of growth is shown in FIG. 10. In the first example, it grows with its facets facing outward from the (0001) plane (or C-plane) and the (000-1) plane. In the second example, it grows with its facets facing outward from the (11-20) plane, the (33-62) plane, and the (000-1) plane. In the latter case, its growth in the direction of C axis is limited.

The III-V nitride compound semiconductor layer 12 is grown under the following conditions.
In the first example:
Growth rate: 0.5 to 8 μm/h
Flow rate of TMG or TMI as the source of III group element:
10 to 90 sccm
Flow rate of $NH_3$ as the source of nitrogen: 5 to 30 slm
Growth temperature: 800 to 950° C.
Ratio of V/III in source for growth: 1000 to 15000
Growth pressure: 0.01 to 1 atm.
In the second example:
Growth rate: 0.5 to 8 μm/h
Flow rate of TMG or TMI as the source of III group element:
10 to 90 sccm
Flow rate of $NH_3$ as the source of nitrogen: 5 to 30 slm
Growth temperature: 950 to 1250° C.
Ratio of V/III in source for growth: 1000 to 15000
Growth pressure: 0.01 to 1 atm.

Figure 11:
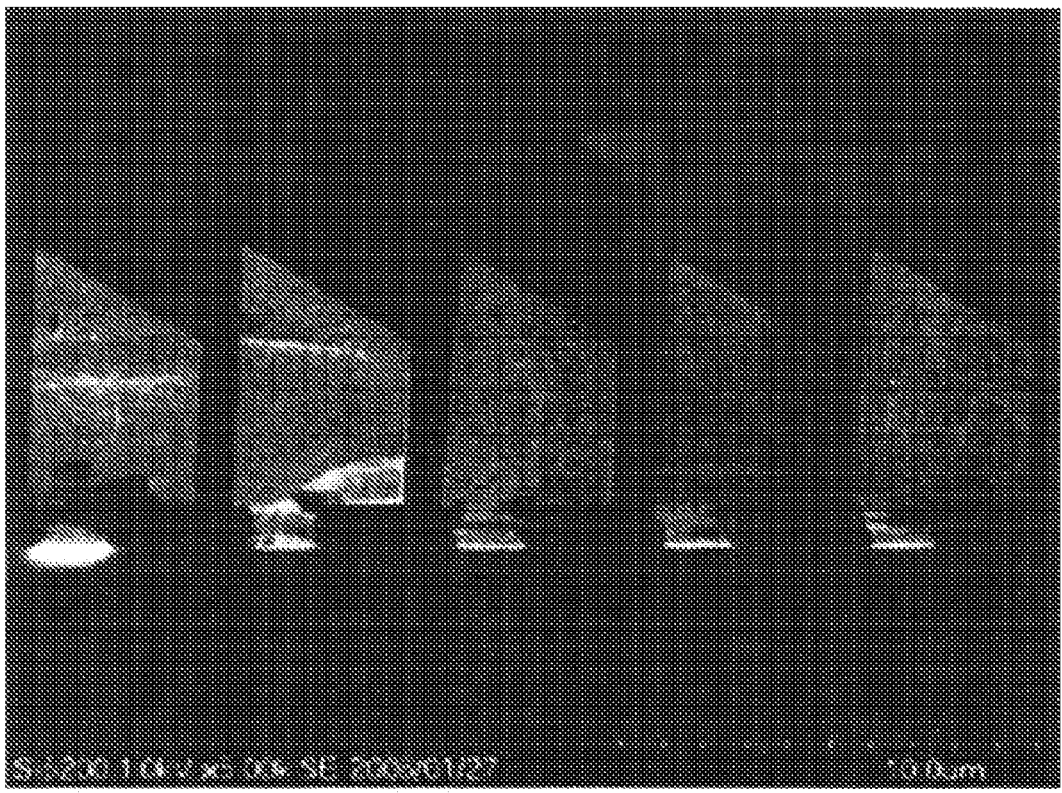
FIG. 11 is an electron micrograph showing a sample of GaN layer which has been grown by the method for growing the III-V nitride compound semiconductor layer according to the third embodiment of the present invention.
Figure 12:
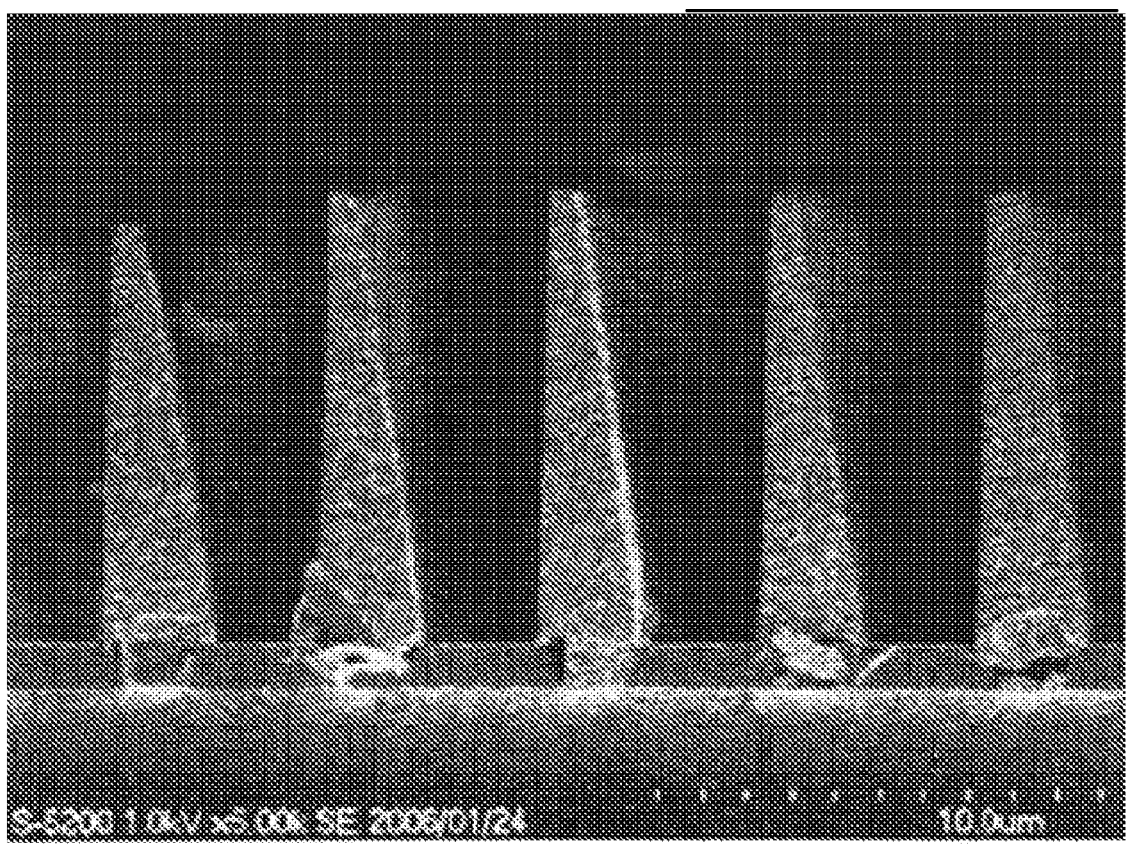
FIG. 12 is an electron micrograph showing a sample of GaN layer which has been grown by the method for growing the III-V nitride compound semiconductor layer according to the third embodiment of the present invention.

FIG. 11 is a cross-sectional transmission electron micrograph showing a sample composed of a sapphire substrate 11 and a GaN layer grown thereon by the MOCVD process (with its facet according to the first example), the GaN layer functioning as the III-V nitride compound semiconductor layer 12. FIG. 12 is a cross-sectional transmission electron micrograph showing a sample composed of a sapphire substrate 11 and a GaN layer grown thereon by the MOCVD process (with its facet according to the second example), the GaN layer functioning as the III-V nitride compound semiconductor layer 12.

Figure 13:
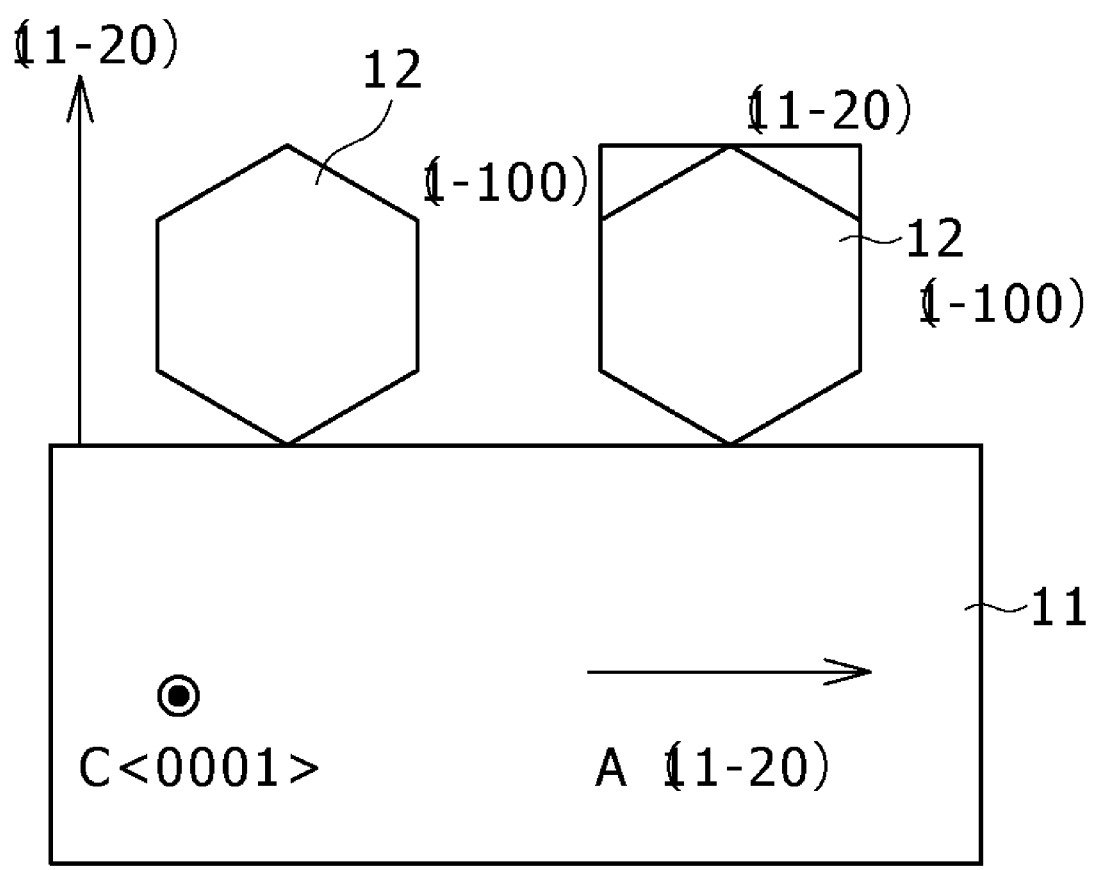
FIG. 13 is a schematic diagram illustrating the method for growing the III-V nitride compound semiconductor layer according to the third embodiment of the present invention.

The III-V nitride compound semiconductor layer 12 in its initial stage of growth according to the third and fourth embodiments is shown in FIG. 13. In the third embodiment, it grows with its facets facing outward from the (1-100) plane. In the fourth embodiment, it grows with its facets facing outward from the (11-20) plane at the top plane and the (1-100) plane at other planes. In the latter case, its growth in the direction of A axis is limited.

The III-V nitride compound semiconductor layer 12 is grown under the following conditions.

In the third example:
Growth rate: 0.5 to 8 μm/h
Flow rate of TMG or TMI as the source of III group element: 10 to 90 sccm
Flow rate of NH$_3$ as the source of nitrogen: 5 to 30 slm
Growth temperature: 800 to 950° C.
Ratio of V/III in source for growth: 1000 to 15000
Growth pressure: 0.01 to 1 atm.

In the fourth example:
Growth rate: 0.5 to 8 μm/h
Flow rate of TMG or TMI as the source of III group element: 10 to 90 sccm
Flow rate of NH$_3$ as the source of nitrogen: 5 to 30 slm
Growth temperature: 950 to 1250° C.
Ratio of V/III in source for growth: 1000 to 15000
Growth pressure: 0.01 to 1 atm.

Figure 14:
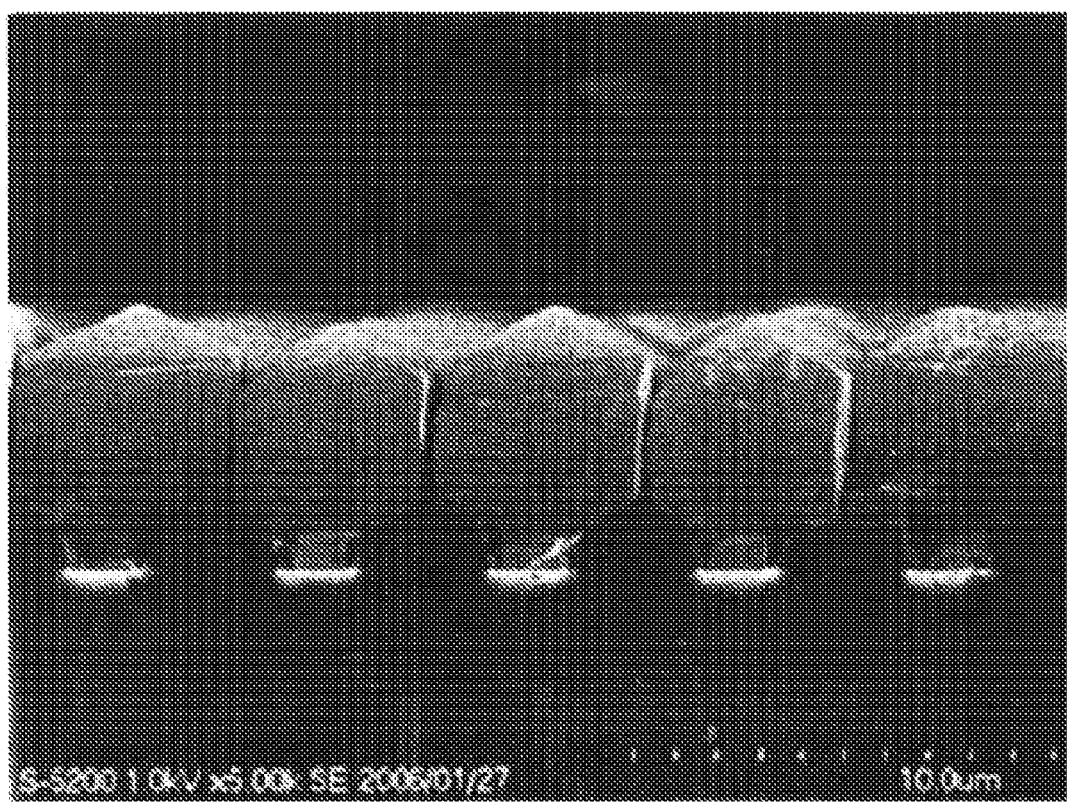
FIG. 14 is an electron micrograph showing a sample of GaN layer which has been grown by the method for growing the III-V nitride compound semiconductor layer according to the third embodiment of the present invention.
Figure 15:
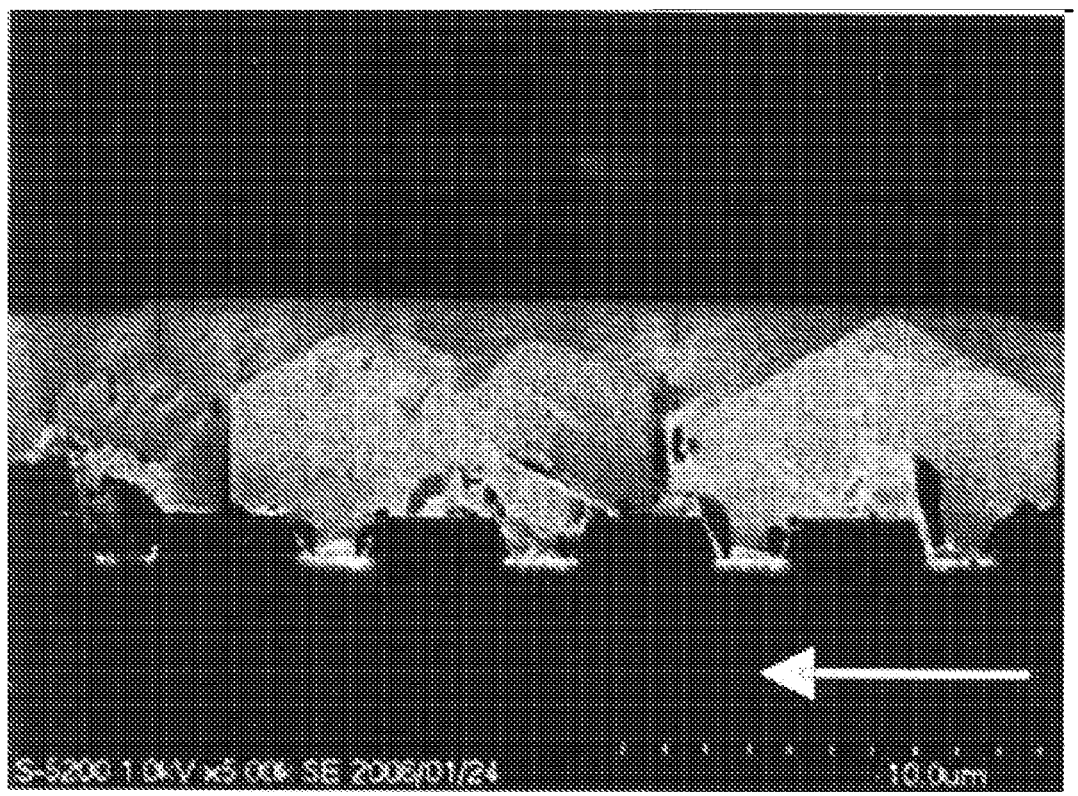
FIG. 15 is an electron micrograph showing a sample of GaN layer which has been grown by the method for growing the III-V nitride compound semiconductor layer according to the third embodiment of the present invention.

FIG. 14 is a cross-sectional transmission electron micrograph showing a sample composed of a sapphire substrate 11 and a GaN layer grown thereon by the MOCVD process (with its facet according to the third example), the GaN layer functioning as the III-V nitride compound semiconductor layer 12. FIG. 15 is a cross-sectional transmission electron micrograph showing a sample composed of a sapphire substrate 11 and a GaN layer grown thereon by the MOCVD process (with its facet according to the fourth example), the GaN layer functioning as the III-V nitride compound semiconductor layer 12.

The fourth embodiment of the present invention mentioned below is concerned with a method for growing a III-V nitride compound semiconductor layer.

Figure 16:
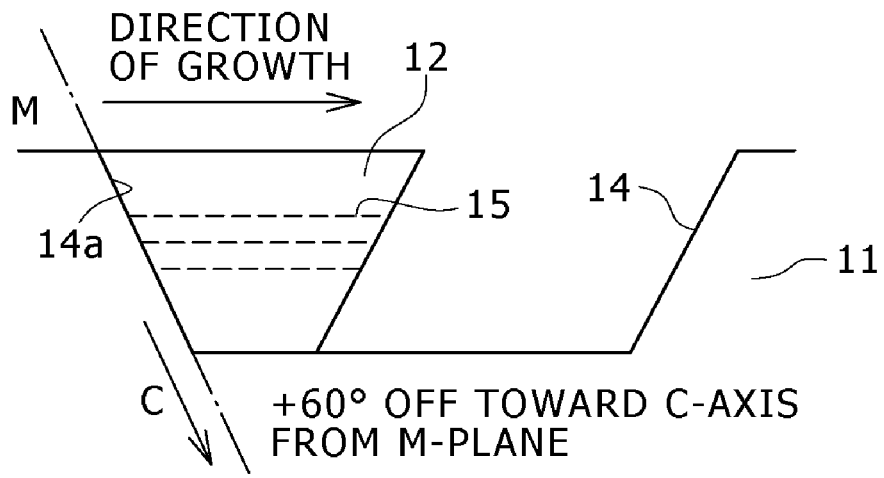
FIG. 16 is a schematic diagram illustrating the method for growing the III-V nitride compound semiconductor layer according to the fourth embodiment of the present invention.

The growing method according to the fourth embodiment shown in FIG. 16 starts with etching the principal plane of the sapphire substrate 11 which is +60° off toward the C-axis from the M-plane. This etching forms a hollow part 14, with a cross section of inverted trapezoid, extending straight in one direction. One side 14a of the hollow part 14 is the M-plane. The thus prepared sapphire substrate 11 permits the III-V nitride compound semiconductor layer 12 to be grown thereon in the same way as in the first embodiment. Growth in the direction indicated by the arrow in FIG. 16 takes place from the side 14a of the M-plane of the hollow part 14. The top of the III-V nitride compound semiconductor layer 12 is the facet of the (11-20) plane (or A-plane). In this case, the dislocation 15 that occurs from the side 14a of the M-plane of the hollow part 14 extends in the direction of growth and hence there is no dislocation that reaches the surface of the III-V nitride compound semiconductor layer 12.

The fifth embodiment of the present invention mentioned below is concerned with a method for growing a III-V nitride compound semiconductor layer.

Figure 17:
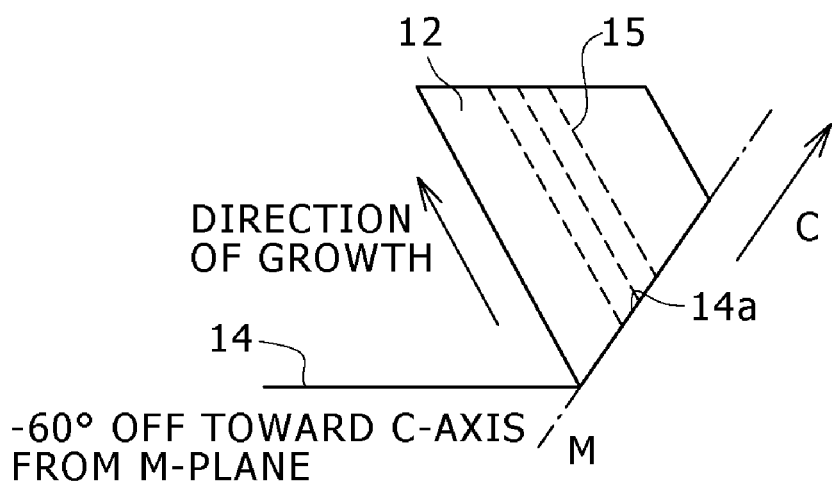
FIG. 17 is a schematic diagram illustrating the method for growing the III-V nitride compound semiconductor layer according to the fifth embodiment of the present invention.

The growing method according to the fifth embodiment shown in FIG. 17 starts with etching the principal plane of the sapphire substrate 11 which is −60° off toward the C-axis from the M-plane. This etching forms a hollow part 14, with a cross section of inverted trapezoid, extending straight in one direction. One side 14a of the hollow part 14 is the M-plane. The thus prepared sapphire substrate 11 permits the III-V nitride compound semiconductor layer 12 to be grown thereon in the same way as in the first embodiment. Growth in the direction indicated by the arrow in FIG. 17 takes place from the side 14a of the M-plane of the hollow part 14. The top of the III-V nitride compound semiconductor layer 12 is the facet of the (0001) plane (or C-plane). In this case, the dislocation 15 that occurs from the side 14a of the M-plane of the hollow part 14 extends in the direction of growth but it is oblique to the top of the III-V nitride compound semiconductor layer 12 and hence there are less dislocations that reach the surface of the III-V nitride compound semiconductor layer 12 than in the case where the III-V nitride compound semiconductor layer 12 grows on the C-plane of the sapphire substrate.

The sixth embodiment of the present invention mentioned below is concerned with a method for growing a III-V nitride compound semiconductor layer.

Figure 18:
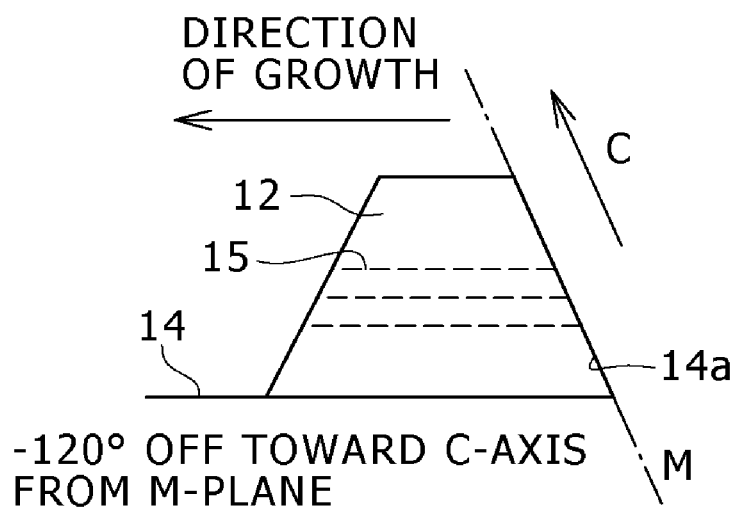
FIG. 18 is a schematic diagram illustrating the method for growing the III-V nitride compound semiconductor layer according to the sixth embodiment of the present invention.

The growing method according to the sixth embodiment shown in FIG. 18 starts with etching the principal plane of the sapphire substrate 11 which is −120° off toward the C-axis from the M-plane. This etching forms a hollow part 14, with a cross section of inverted trapezoid, extending straight in one direction. One side 14a of the hollow part 14 is the M-plane. The thus prepared sapphire substrate 11 permits the III-V nitride compound semiconductor layer 12 to be grown thereon in the same way as in the first embodiment. Growth in the direction indicated by the arrow in FIG. 18 takes place from the side 14a of the M-plane of the hollow part 14. The top of the III-V nitride compound semiconductor layer 12 is the facet of the (11-20) plane (or A-plane). In this case, the dislocation 15 that occurs from the side 14a of the M-plane of the hollow part 14 extends in the direction of growth and hence there is no dislocation that reaches the surface of the III-V nitride compound semiconductor layer 12.

The seventh embodiment of the present invention mentioned below is concerned with a method for growing a III-V nitride compound semiconductor layer.

Figure 19:
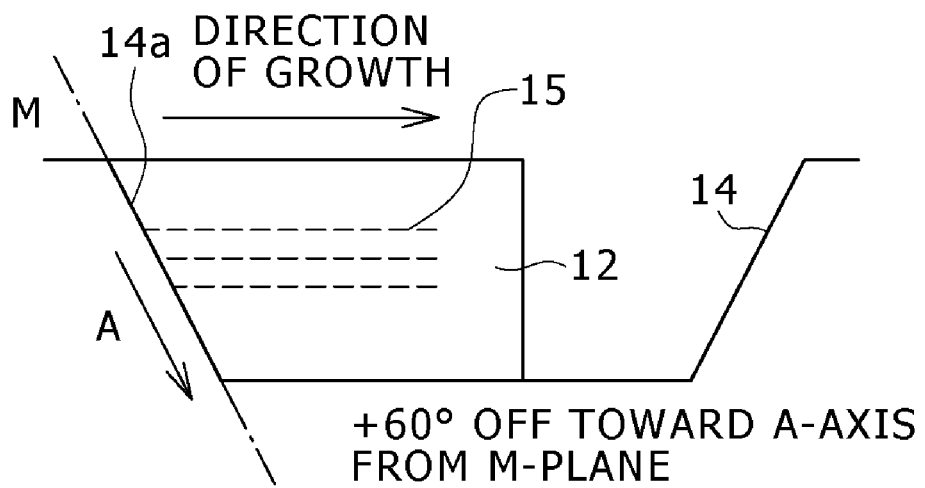
FIG. 19 is a schematic diagram illustrating the method for growing the III-V nitride compound semiconductor layer according to the seventh embodiment of the present invention.

The growing method according to the seventh embodiment shown in FIG. 19 starts with etching the principal plane of the sapphire substrate 11 which is +60° off toward the A-axis from the M-plane. This etching forms a hollow part 14, with a cross section of inverted trapezoid, extending straight in one direction. One side 14a of the hollow part 14 is the M-plane. The thus prepared sapphire substrate 11 permits the III-V nitride compound semiconductor layer 12 to be grown thereon in the same way as in the second embodiment. Growth in the direction indicated by the arrow in FIG. 19 takes place from the side 14a of the M-plane of the hollow part 14. The top of the III-V nitride compound semiconductor layer 12 is the facet of the (1-100) plane (or M-plane). In this case, the dislocation 15 that occurs from the side 14a of the M-plane of the hollow part 14 extends in the direction of growth and hence there is no dislocation that reaches the surface of the III-V nitride compound semiconductor layer 12.

The eighth embodiment of the present invention mentioned below is concerned with a method for growing a III-V nitride compound semiconductor layer.

Figure 20:
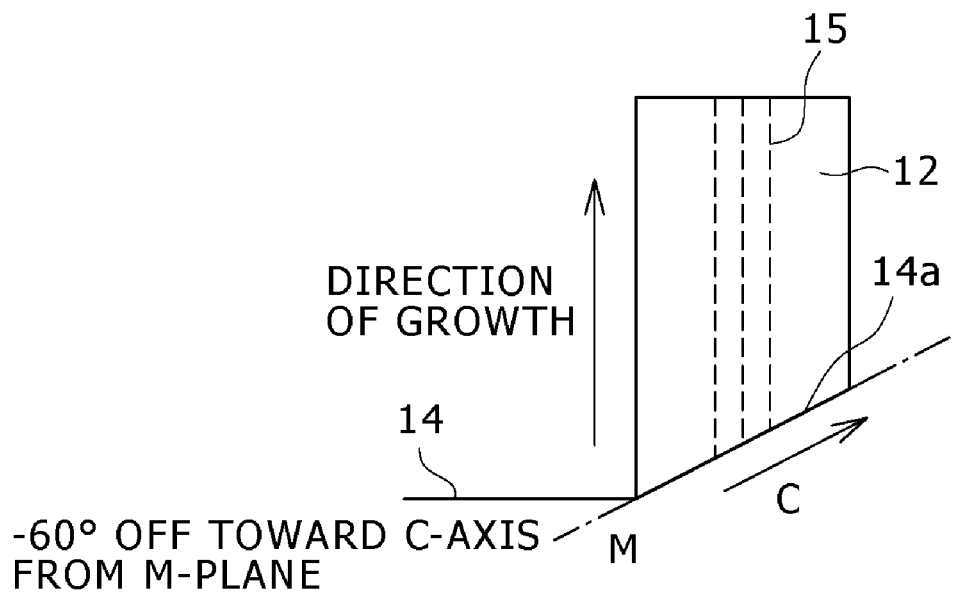
FIG. 20 is a schematic diagram illustrating the method for growing the III-V nitride compound semiconductor layer according to the eighth embodiment of the present invention.

The growing method according to the eighth embodiment shown in FIG. 20 starts with etching the principal plane of the sapphire substrate 11 which is −60° off toward the C-axis from the M-plane. This etching forms a hollow part 14, with a cross section of inverted trapezoid, extending straight in one direction. One side 14a of the hollow part 14 is the M-plane. The thus prepared sapphire substrate 11 permits the III-V nitride compound semiconductor layer 12 to be grown thereon in the same way as in the second embodiment. Growth in the direction indicated by the arrow in FIG. 20 takes place from the side 14a of the M-plane of the hollow part 14. The top of the III-V nitride compound semiconductor layer 12 is the facet of the (0001) plane (or C-plane). In this case, the dislocation 15 that occurs from the side 14a of the M-plane of the hollow part 14 extends in the direction of growth but only those dislocations that occur from the side 14a of the hollow part 14 reach the surface of the III-V nitride compound semiconductor layer 12 and hence there are less dislocations that reach the surface of the III-V nitride compound semiconductor layer 12 than in the case where the III-V nitride compound semiconductor layer 12 grows on the C-plane of the sapphire substrate.

The ninth embodiment of the present invention mentioned below is concerned with a method for growing a III-V nitride compound semiconductor layer.

Figure 21:
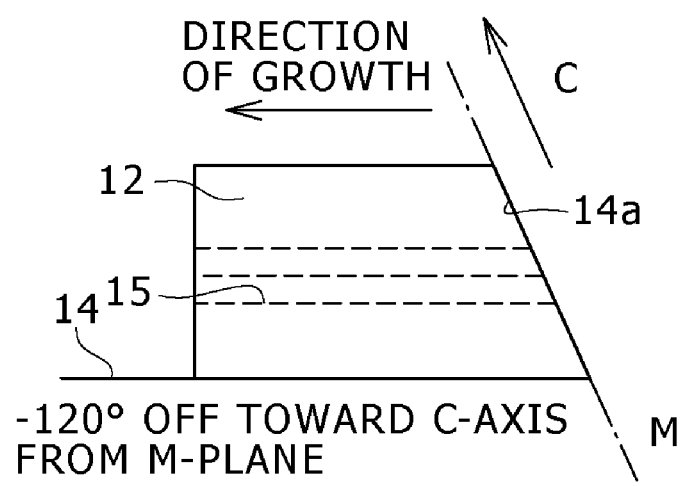
FIG. 21 is a schematic diagram illustrating the method for growing the III-V nitride compound semiconductor layer according to the ninth embodiment of the present invention.

The growing method according to the ninth embodiment shown in FIG. 21 starts with etching the principal plane of the sapphire substrate 11 which is −120° off toward the C-axis from the M-plane. This etching forms a hollow part 14, with a cross section of trapezoid, extending straight in one direction. One side 14a of the hollow part 14 is the M-plane. The thus prepared sapphire substrate 11 permits the III-V nitride compound semiconductor layer 12 to be grown thereon in the same way as in the second embodiment. Growth in the direction indicated by the arrow in FIG. 21 takes place from the side 14a of the M-plane of the hollow part 14. The top of the III-V nitride compound semiconductor layer 12 is the facet of the (1-100) plane (or M-plane). In this case, the dislocation 15 that occurs from the side 14a of the M-plane of the hollow part 14 extends in the direction of growth and hence there is no dislocation that reaches the surface of the III-V nitride compound semiconductor layer 12.

The tenth embodiment of the present invention mentioned below is concerned with a method for growing a III-V nitride compound semiconductor layer.

Figure 22:
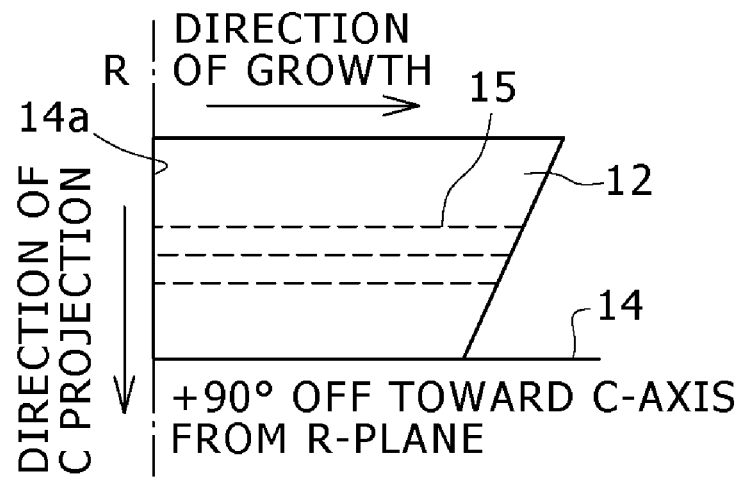
FIG. 22 is a schematic diagram illustrating the method for growing the III-V nitride compound semiconductor layer according to the tenth embodiment of the present invention.

The growing method according to the tenth embodiment shown in FIG. 22 starts with etching the principal plane of the sapphire substrate 11 which is +90° off toward the C-axis from the R-plane. This etching forms a hollow part 14, with a cross section of rectangle, extending straight in one direction. One side 14a of the hollow part 14 is the R-plane. The thus prepared sapphire substrate 11 permits the III-V nitride compound semiconductor layer 12 to be grown thereon in the same way as in the third embodiment. Growth in the direction indicated by the arrow in FIG. 22 takes place from the side 14a of the R-plane of the hollow part 14. The top of the III-V nitride compound semiconductor layer 12 is the facet of the (000-1) plane. In this case, the dislocation 15 that occurs from the side 14a of the R-plane of the hollow part 14 extends in the direction of growth and hence there is no dislocation that reaches the surface of the III-V nitride compound semiconductor layer 12.

The eleventh embodiment of the present invention mentioned below is concerned with a method for growing a III-V nitride compound semiconductor layer.

Figure 23:
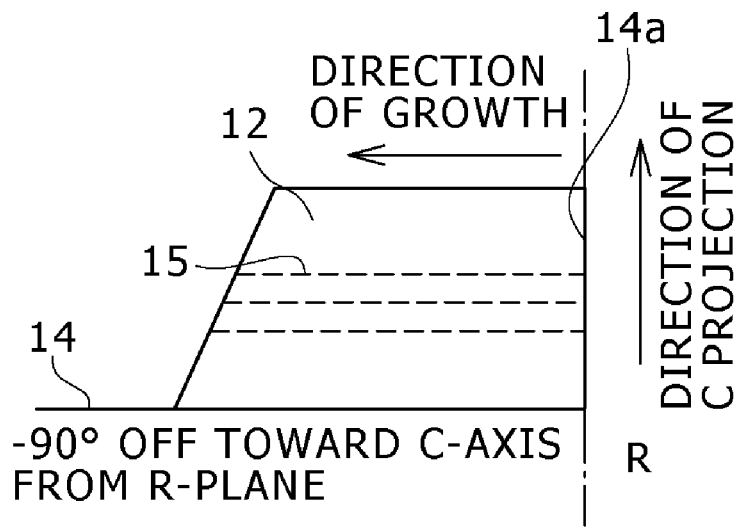
FIG. 23 is a schematic diagram illustrating the method for growing the III-V nitride compound semiconductor layer according to the eleventh embodiment of the present invention.

The growing method according to the eleventh embodiment shown in FIG. 23 starts with etching the principal plane of the sapphire substrate 11 which is −90° off toward the C-axis from the R-plane. This etching forms a hollow part 14, with a cross section of rectangle, extending straight in one direction. One side 14a of the hollow part 14 is the R-plane. The thus prepared sapphire substrate 11 permits the III-V nitride compound semiconductor layer 12 to be grown thereon in the same way as in the third embodiment (the first example). Growth in the direction indicated by the arrow in FIG. 23 takes place from the side 14a of the R-plane of the hollow part 14. The top of the III-V nitride compound semiconductor layer 12 is the facet of the (0001) plane (or the C-plane). In this case, the dislocation 15 that occurs from the side 14a of the R-plane of the hollow part 14 extends in the direction of growth and hence there is no dislocation that reaches the surface of the III-V nitride compound semiconductor layer 12.

The twelfth embodiment of the present invention mentioned below is concerned with a method for growing a III-V nitride compound semiconductor layer.

Figure 24:
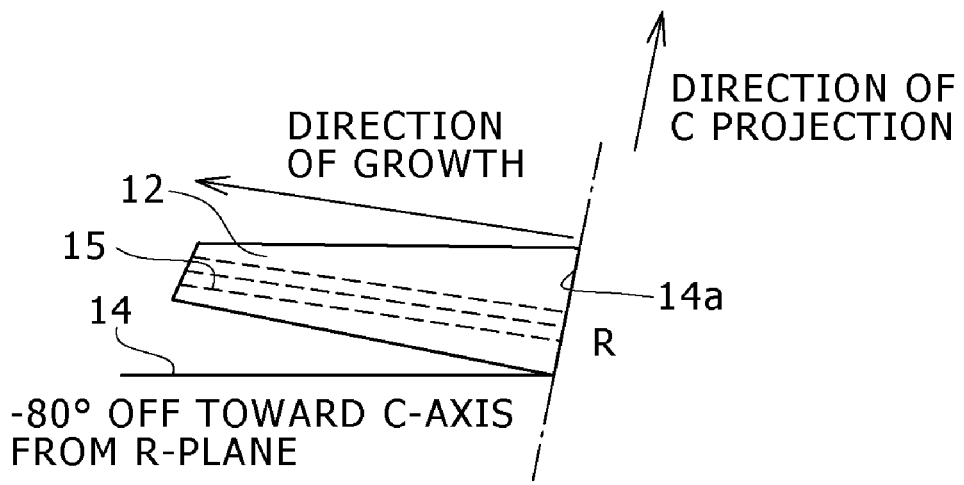
FIG. 24 is a schematic diagram illustrating the method for growing the III-V nitride compound semiconductor layer according to the twelfth embodiment of the present invention.

The growing method according to the twelfth embodiment shown in FIG. 24 starts with etching the principal plane of the sapphire substrate 11 which is −80° off toward the C-axis from the R-plane. This etching forms a hollow part 14, with a cross section of trapezoid, extending straight in one direction. One side 14a of the hollow part 14 is the R-plane. The thus prepared sapphire substrate 11 permits the III-V nitride compound semiconductor layer 12 to be grown thereon in the same way as in the third embodiment (the second example). Growth in the direction indicated by the arrow in FIG. 24 takes place from the side 14a of the R-plane of the hollow part 14. The top of the III-V nitride compound semiconductor layer 12 is the facet of the (33-62) plane. In this case, the dislocation 15 that occurs from the side 14a of the R-plane of the hollow part 14 extends in the direction of growth and hence there are very few dislocations that reach the surface of the III-V nitride compound semiconductor layer 12.

The thirteenth embodiment of the present invention mentioned below is concerned with a method for growing a III-V nitride compound semiconductor layer.

Figure 25:
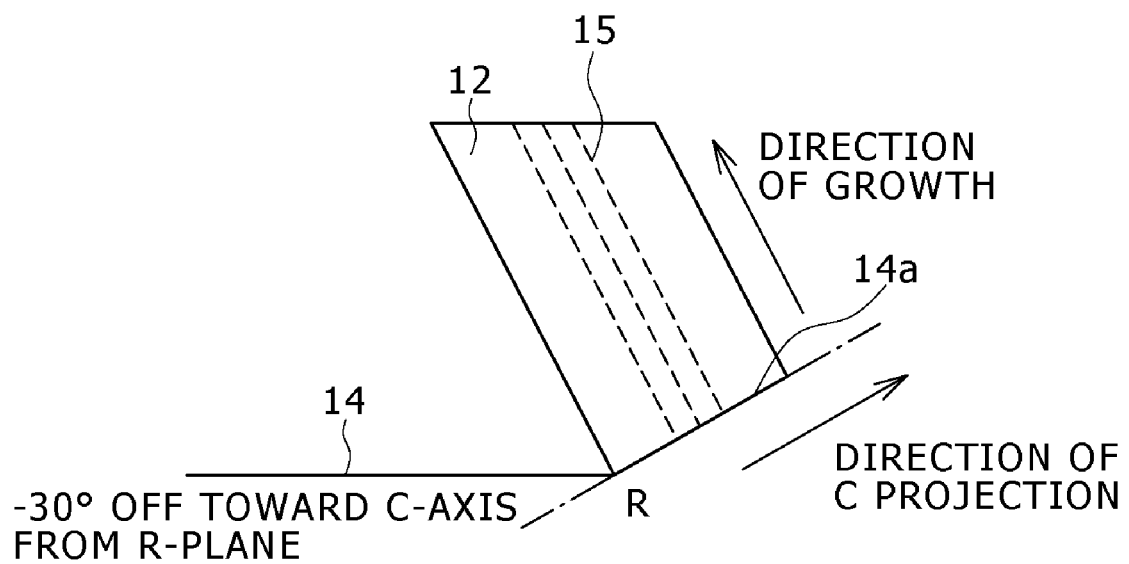
FIG. 25 is a schematic diagram illustrating the method for growing the III-V nitride compound semiconductor layer according to the thirteenth embodiment of the present invention.

The growing method according to the thirteenth embodiment shown in FIG. 25 starts with etching the principal plane of the sapphire substrate 11 which is −30° off toward the C-axis from the R-plane. This etching forms a hollow part 14, with a cross section of inverted trapezoid, extending straight in one direction. One side 14a of the hollow part 14 is the R-plane. The thus prepared sapphire substrate 11 permits the III-V nitride compound semiconductor layer 12 to be grown thereon in the same way as in the third embodiment (the first example). Growth in the direction indicated by the arrow in FIG. 25 takes place from the side 14a of the R-plane of the hollow part 14. The top of the III-V nitride compound semiconductor layer 12 is the facet of the (11-22) plane. In this case, the dislocation 15 that occurs from the side 14a of the R-plane of the hollow part 14 extends in the direction of growth but this direction is oblique to the top of the III-V nitride compound semiconductor layer 12 and hence there are very few dislocations that reach the surface of the III-V nitride compound semiconductor layer 12.

The fourteenth embodiment of the present invention mentioned below is concerned with a method for growing a III-V nitride compound semiconductor layer.

Figure 26:
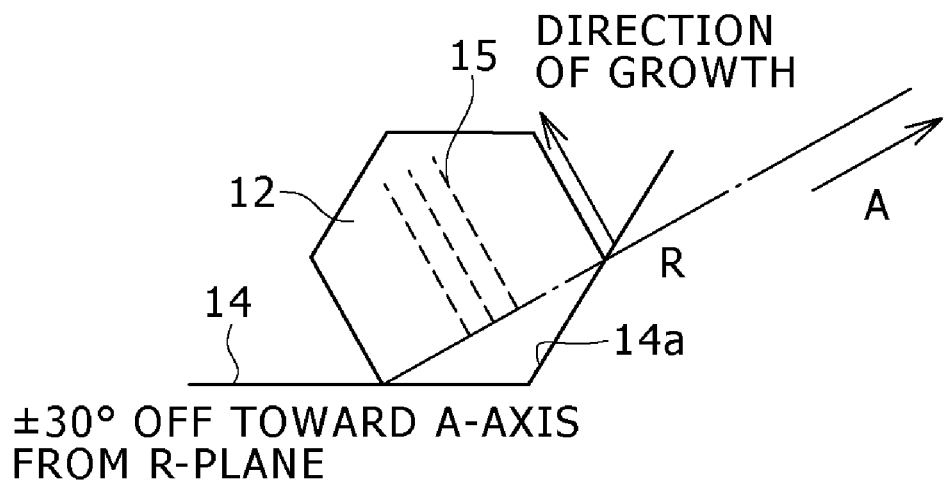
FIG. 26 is a schematic diagram illustrating the method for growing the III-V nitride compound semiconductor layer according to the fourteenth embodiment of the present invention.

The growing method according to the fourteenth embodiment shown in FIG. 26 starts with etching the principal plane of the sapphire substrate 11 which is ±30° off toward the A-axis from the R-plane. This etching forms a hollow part 14, with a cross section of inverted trapezoid, extending straight in one direction. One side 14a of the hollow part 14 is the R-plane. The thus prepared sapphire substrate 11 permits the III-V nitride compound semiconductor layer 12 to be grown thereon in the same way as in the third embodiment (the third example). Growth in the direction indicated by the arrow in FIG. 26 takes place from the side 14a of the R-plane of the hollow part 14. The top of the III-V nitride compound semiconductor layer 12 is the facet of the (1-100) plane. In this case, the dislocation 15 that occurs from the side 14a of the R-plane of the hollow part 14 extends in the direction of growth but this direction is oblique to the top of the III-V nitride compound semiconductor layer 12 and hence there is no dislocation that reaches the surface of the III-V nitride compound semiconductor layer 12.

The fifteenth embodiment of the present invention mentioned below is concerned with a method for growing a III-V nitride compound semiconductor layer.

Figure 27:
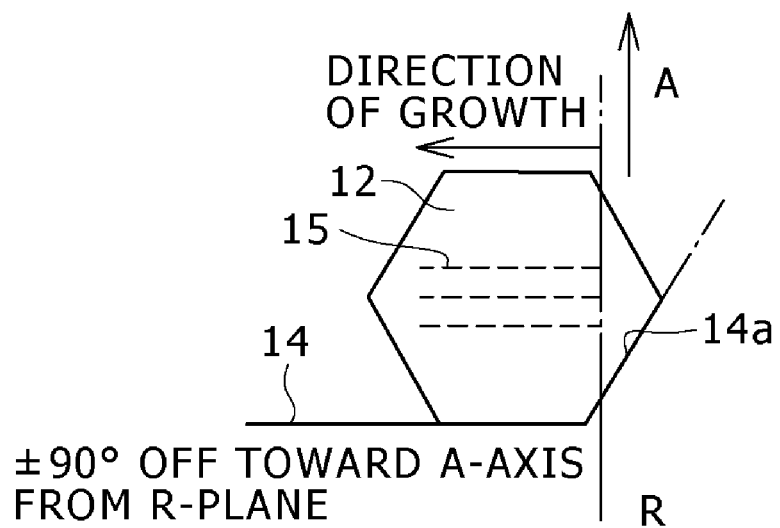
FIG. 27 is a schematic diagram illustrating the method for growing the III-V nitride compound semiconductor layer according to the fifteenth embodiment of the present invention.

The growing method according to the fifteenth embodiment shown in FIG. 27 starts with etching the principal plane of the sapphire substrate 11 which is ±90° off toward the A-axis from the R-plane. This etching forms a hollow part 14, with a cross section of inverted trapezoid, extending straight in one direction. One side 14a of the hollow part 14 is the R-plane. The thus prepared sapphire substrate 11 permits the III-V nitride compound semiconductor layer 12 to be grown thereon in the same way as in the third embodiment (the third example). Growth in the direction indicated by the arrow in FIG. 26 takes place from the side 14a of the R-plane of the hollow part 14. The top of the III-V nitride compound semiconductor layer 12 is the facet of the (33-62) plane. In this case, the dislocation 15 that occurs from the side 14a of the R-plane of the hollow part 14 extends in the direction of growth and hence there is no dislocation that reaches the surface of the III-V nitride compound semiconductor layer 12.

The sixteenth embodiment of the present invention mentioned below is concerned with a method for producing a light-emitting diode.

The production method according to the sixteenth embodiment starts with growing a III-V nitride compound semiconductor layer 12 with the (11-22) plane direction on the sapphire substrate 11 having the M-plane as the principal plane, in the same way as in the first embodiment.

Figure 28A:
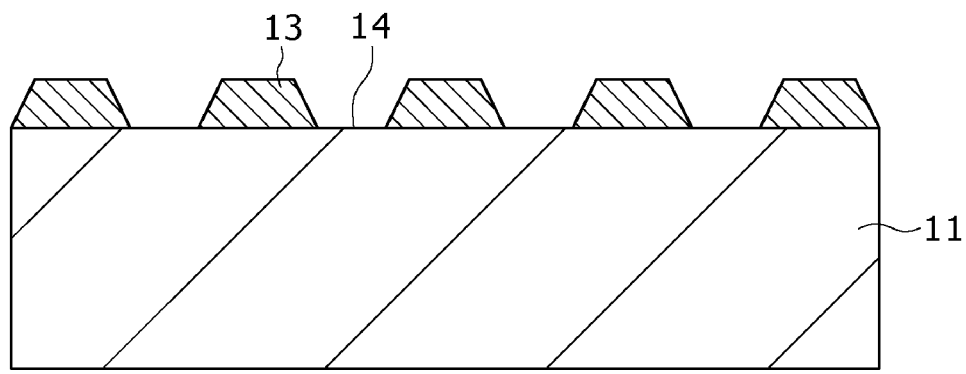
FIGS. 28A to 28C are schematic diagrams illustrating the method for producing a light-emitting diode according to the sixteenth embodiment of the present invention.

To be specific, as shown in FIG. 28A, on the sapphire substrate 11 having the M-plane as the principal plane are formed the raised parts 13 (each having a trapezoidal cross section) at regular intervals. Between the raised parts 13, the hollow part 14 having a cross section of inverted trapezoid is formed. The raised parts 13 and the hollow parts 14 in their plan view extend straight in one direction for example. The raised parts 13 are formed from SiN (such as $Si_3N_4$) or $SiO_2$ by any known method as follows. First, the sapphire substrate 11 is entirely coated with a film of the material for the raised parts 13 by CVD process, vacuum vapor deposition, or sputtering. Then, the film is coated with a resist of prescribed pattern by photolithography. Finally, the film undergoes taper etching by reactive ion etching (RIE) or the like through the resist pattern as a mask. Thus there are obtained the raised parts 13 each having a trapezoidal cross section.

Figure 28B:
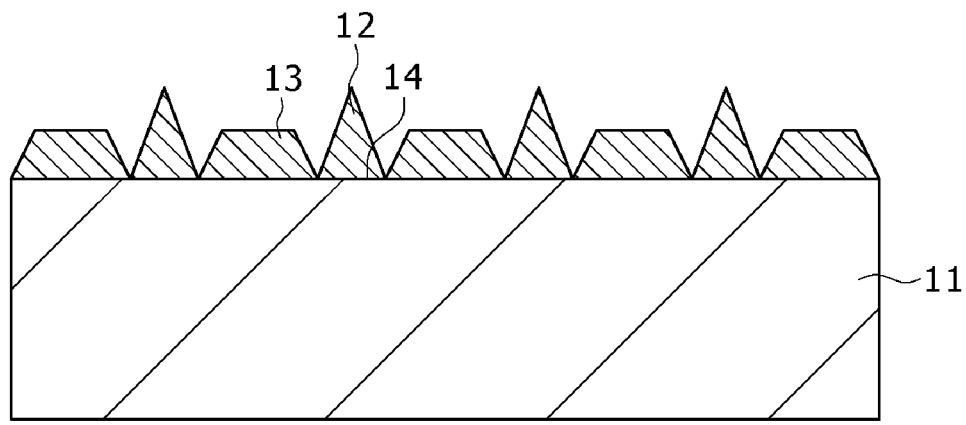

After thermal cleaning is performed on the sapphire substrate 11 and the raised parts 13 to clean their surface, the sapphire substrate 11 is coated with a buffer layer of GaN, AlN, CrN, Cr-doped GaN, or Cr-doped AlN (not shown) by any know process at a growth temperature of about 550° C. On the bottom of the hollow part 14 is grown the III-V nitride compound semiconductor layer 12 by the MOCVD process in the same way as in the first embodiment, as shown in FIG. 28B. It may be a GaN layer which is doped with a p-type or n-type impurity or not doped.

Figure 28C:
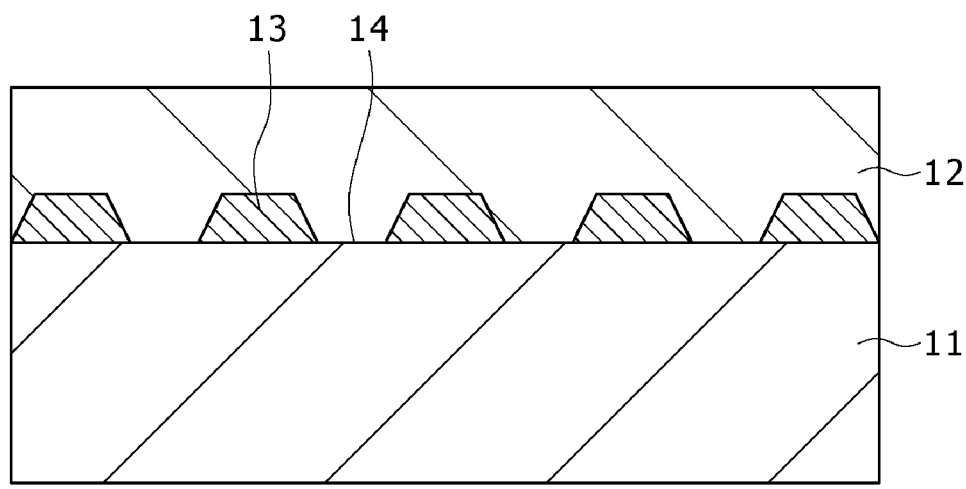

The growing step is continued under the condition that the facet of the (11-22) plane preferentially appears, so that the III-V nitride compound semiconductor layer 12 grows into a thick continuous film, as shown in FIG. 28C.

Figure 29:
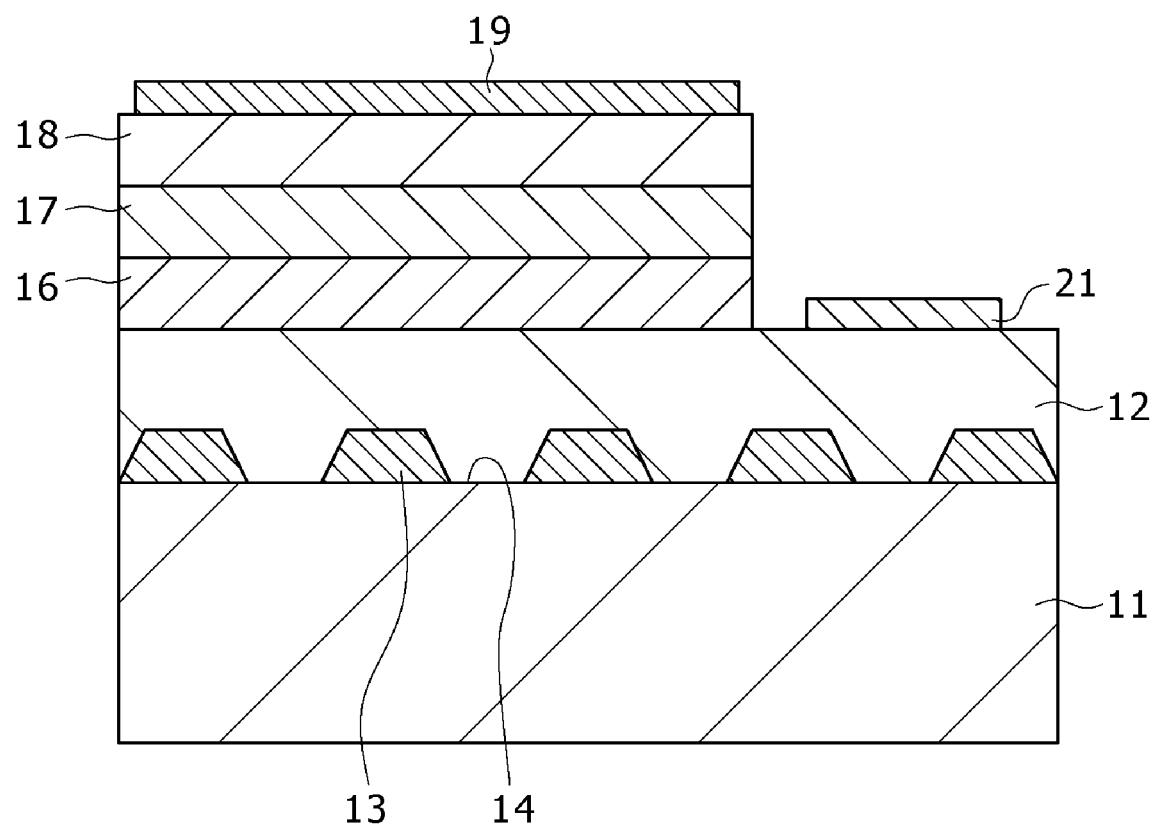
FIG. 29 is a schematic diagram illustrating the method for producing a light-emitting diode according to the sixteenth embodiment of the present invention.

On the III-V nitride compound semiconductor layer 12 are sequentially grown the n-type III-V nitride compound semiconductor layer 16, the active layer 17 of III-V nitride compound semiconductor, and the p-type III-V nitride compound semiconductor layer 18 by e.g. the MOCVD process as shown in FIG. 29. These three layers 16, 17, and 18 have the (11-22) plane direction. In this case, the III-V nitride compound semiconductor layer 15 is of n-type.

The sapphire substrate 11 on which the III-V nitride compound semiconductor layers have been grown are removed from the MOCVD apparatus.

On the p-type III-V nitride compound semiconductor layer 18 the p-side electrode 19 from an ohmic metal having a high reflectance for the light of emitted wavelength is formed.

Heat treatment is performed to activate the p-type impurity in the p-type III-V nitride compound semiconductor layer 18. The atmosphere for heat treatment is a mixture gas composed of $N_2$ (99%) and $O_2$ (1%). The temperature of heat treatment is 550 to 750° C. (e.g., 650° C.) or 580 to 620° C. (e.g., 600° C.). Addition of $O_2$ to $N_2$ enhances activation. The atmospheric gas, which is $N_2$ or a mixture of $N_2$ and $O_2$, may be mixed with a nitrogen halide (such as $NF_3$ and $NCl_3$) as a source of F or Cl, which has high electronegativity like O and N. Duration of heat treatment is 5 minutes to 2 hours, or 40 minutes to 2 hours, usually 10 to 60 minutes. The temperature of heat treatment is kept low to protect the active layer 16 from deterioration. Incidentally, this heat treatment may be carried out after the p-type III-V nitride compound semiconductor layer 18 has been epitaxially grown and before the p-side electrode 19 is formed.

The layers 16, 17, and 18 undergo patterning into a prescribed shape by RIE method, powder blasting, or sand blasting, so as to form the desired mesa part.

On the III-V nitride compound semiconductor layer 12 is formed the n-side electrode 21, which is adjacent to the mesa part.

The substrate 11, which has the light-emitting structure formed thereon, undergoes grinding or lapping on its back side, so as to reduce its thickness. It is divided into bars by scribing and each bar is divided into chips by scribing. In this way there are obtained light-emitting diodes as desired.

The light-emitting diode mentioned above has the typical structure as follows.

The III-V nitride compound semiconductor layer 12 is an n-type GaN layer. The n-type III-V nitride compound semiconductor layer 16 is composed of an n-type GaN layer and an n-type GaInN layer (upward). The p-type III-V nitride compound semiconductor layer 18 is composed of a p-type AlInN layer, a p-type GaN layer, and a p-type GaInN layer (upward). The active layer 17 has e.g. the multiple quantum well (MQW) structure consisting of e.g. GaInN quantum well layers and GaN barrier layers which are placed one over the other. The In content in the active layer 17 varies depending on the desired wavelength of the light-emitting diode. It is about 11% for 405 nm, about 18% for 450 nm, and about 24% for 520 nm for example. The p-side electrode 19 is formed from Ag or Pd/Ag. It may have an optional barrier metal such as Ti, W, Cr, WN, and CrN. The n-side electrode 21 has the Ti/Pt/Au structure.

According to the sixteenth embodiment, the active layer 14 has the (11-22) plane direction and controls the piezoelectric field. Consequently, it suppresses the quantum confined Stark effect therein. This greatly contributes to the luminous efficiency of the light-emitting diode based on a III-V nitride compound semiconductor. In addition, the layers 16, 17, and 18 can be grown easily, which leads to the easy production of the semiconductor light-emitting element.

The seventeenth embodiment of the present invention mentioned below is concerned with a method for producing a light-emitting diode.

Figure 30A:
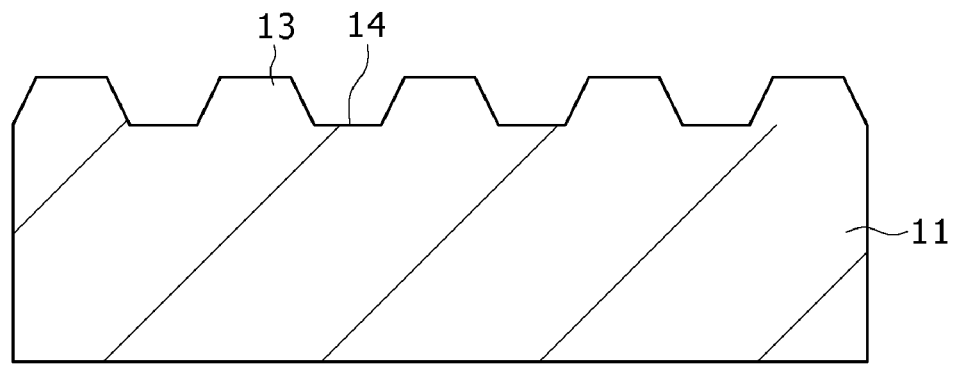
FIGS. 30A to 30C are schematic diagrams illustrating the method for producing a light-emitting diode according to the seventeenth embodiment of the present invention.
Figure 30B:
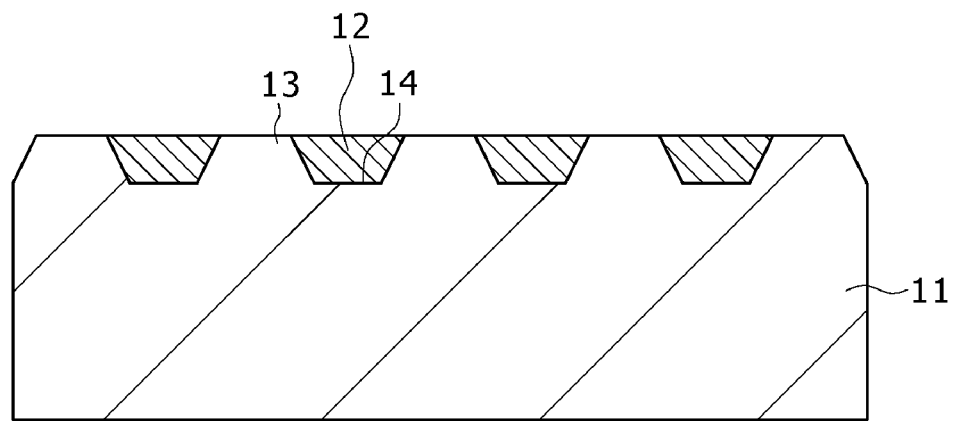

The production method according to the seventeenth embodiment starts with etching the sapphire substrate 11, whose principal plane is +60° off toward the C-axis from the M-plane, in the same way as in the fourth embodiment, as shown in FIG. 30A. This etching gives rise to the hollow parts 14 whose one side 14a is the M-plane. The III-V nitride compound semiconductor layer 12 having the (11-22) plane direction is grown on the sapphire substrate 11, until the hollow parts 14 are completely filled, as shown in FIG. 30B, in the same way as in the fourth embodiment.

Figure 30C:
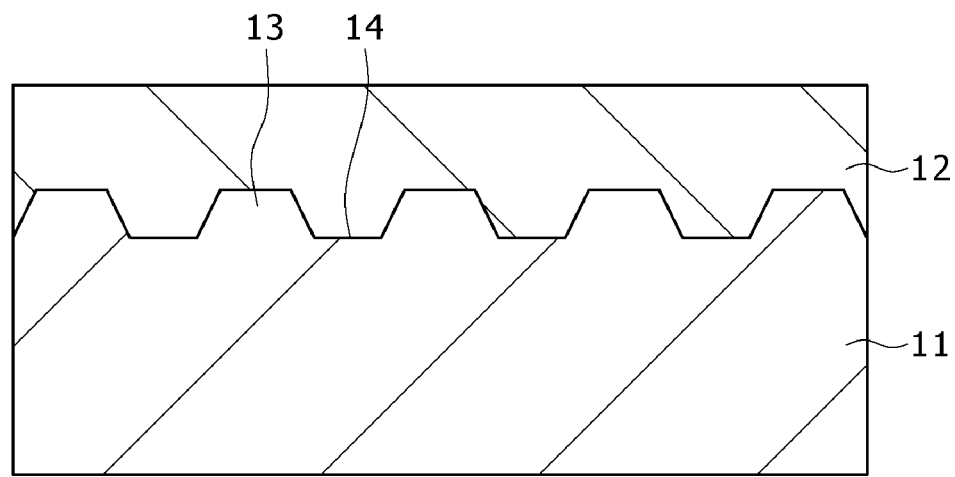

Growing is continued such that the (11-20) plane facet preferentially appears and the III-V nitride compound semiconductor layer 12 becomes thick to form a continuous film as shown in FIG. 30C.

Subsequently, the same steps as in the sixteenth embodiment are carried out to complete the production of the light-emitting diode as desired. Incidentally, the n-type III-V nitride compound semiconductor layer 16, the active layer 17, and the p-type III-V nitride compound semiconductor layer 18 have the (11-20) plane (or A-plane) direction.

According to the seventeenth embodiment, the active layer 14 has the (11-20) plane (or A-plane) direction and controls the piezoelectric field. Consequently, it suppresses the quantum confined Stark effect therein. It also eliminates threading dislocations in the III-V nitride compound semiconductor layer 12. This in turn eliminates threading dislocations in the layers 16, 17, and 18 formed on the layer 12. Hence the layers 16, 17, and 18 have a good crystal quality, which leads to the high luminous efficiency of the light-emitting diode based on a III-V nitride compound semiconductor. In addition, the layers 16, 17, and 18 can be grown easily, which leads to the easy production of the semiconductor light-emitting element.

The following is a description of the eighteenth embodiment of the present invention.

The eighteenth embodiment is concerned with a backlight of light-emitting diode consisting of a blue light-emitting diode and a green light-emitting diode (both produced by the method of the sixteenth or seventeenth embodiment) in combination with a red light-emitting diode (such as AlGaInP light-emitting diode) which is prepared separately.

The backlight is produced as follows. A blue light-emitting diode is formed on the sapphire substrate 11 by the method according to the sixteenth or seventeenth embodiment. The p-side electrode 19 and the n-side electrode 21 each are provided with bumps (not shown). After division into chips, each chip is made into a blue light-emitting diode by flip chip bonding. In the same way as above, a green light-emitting diode is formed by flip chip bonding. On the other hand, a red light-emitting diode is formed by coating an n-type GaAs substrate with an AlGaInP semiconductor layer and then forming thereon a p-side electrode. This diode is also used in the form of chip.

Figure 31A:
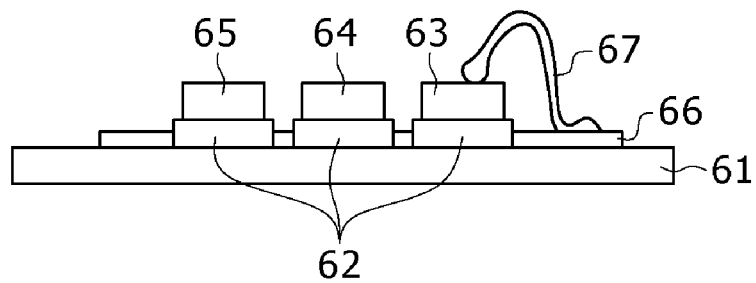
FIGS. 31A to 31C are schematic diagrams illustrating the method for producing a light-emitting diode backlight according to the eighteenth embodiment of the present invention.

These red, green, and blue light-emitting diode chips are mounted on a sub-mount of AlN. The resulting assemblies are arranged regularly on a substrate of Al, with the sub-mount downward, as shown in FIG. 31A. Numerals 61, 62, 63, 64, and 65 in FIG. 31A refer respectively to the substrate, the sub-mount, the red light-emitting diode chip, the green light-emitting diode chip, and the blue light-emitting diode chip. These light-emitting diode chips measure 350 μm square. The red light-emitting diode chip 63 is mounted such that its n-side electrode comes into contact with the sub-mount 62. The green light-emitting diode chip 64 and the blue light-emitting chip 65 are mounted such that their p-side electrode and n-side electrode come into contact with the sub-mount 62 through bumps. The sub-mount 62, on which the red light-emitting diode chips 63 are mounted, has lead electrodes (not shown) regularly formed thereon for the n-side electrodes. On the lead electrode is mounted that part of the red light-emitting diode chip 63 which is adjacent to the n-side electrode. The p-side electrode of the red light-emitting diode chip 63 and the pad electrode 66 on the substrate 61 are connected together through the bonded wire 67. And, one end of the lead electrode and another pad electrode on the substrate 61 are connected together through the bonded wire (not shown). The sub-mount 62, on which the green light-emitting diode chips 64 are mounted, has lead electrodes (not shown) regularly formed thereon for the p-side electrode and the n-side electrodes. On the lead electrode is mounted through bumps thereon that part of the green light-emitting diode chip 64 which is adjacent to the p-side electrode and the n-side electrode. One end of the lead electrode for the p-side electrode of the green light-emitting diode chip 64 is connected to the pad electrode on the substrate 61 through the bonded wire (not shown), and one end of the lead electrode for the n-side electrode of the green light-emitting diode chip 64 is connected to the pad electrode on the substrate 61 through the bonded wire (not shown). The blue light-emitting diode chip 65 also has the same structure as mentioned above.

The sub-mount 62 may be omitted. In this case, the red, green, and blue light-emitting diode chips 63, 64, and 65 may be directly mounted on a printed circuit board or chassis inside wall capable of heat dissipation. Such direct mounting reduces the production cost of backlight or panel.

Figure 31B:
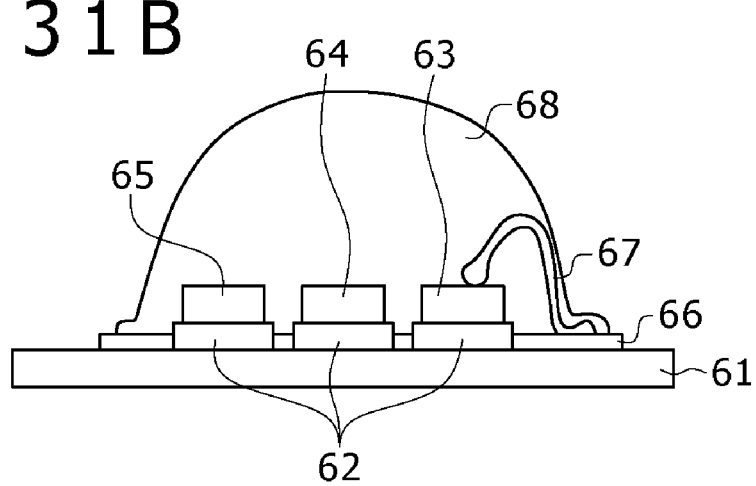
Figure 31C:
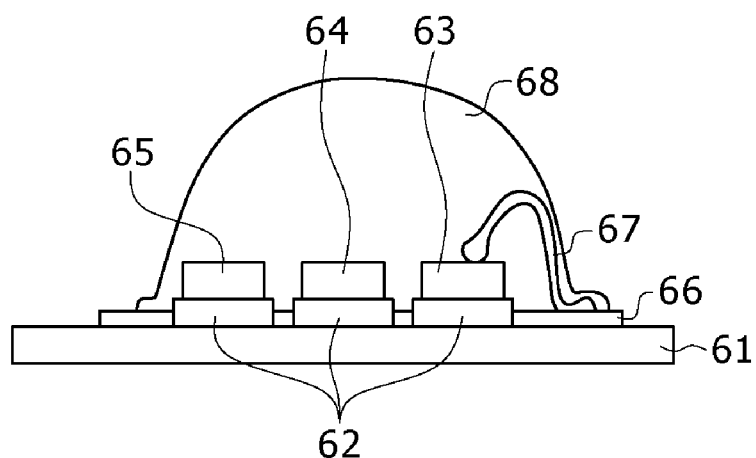
Figure 32:
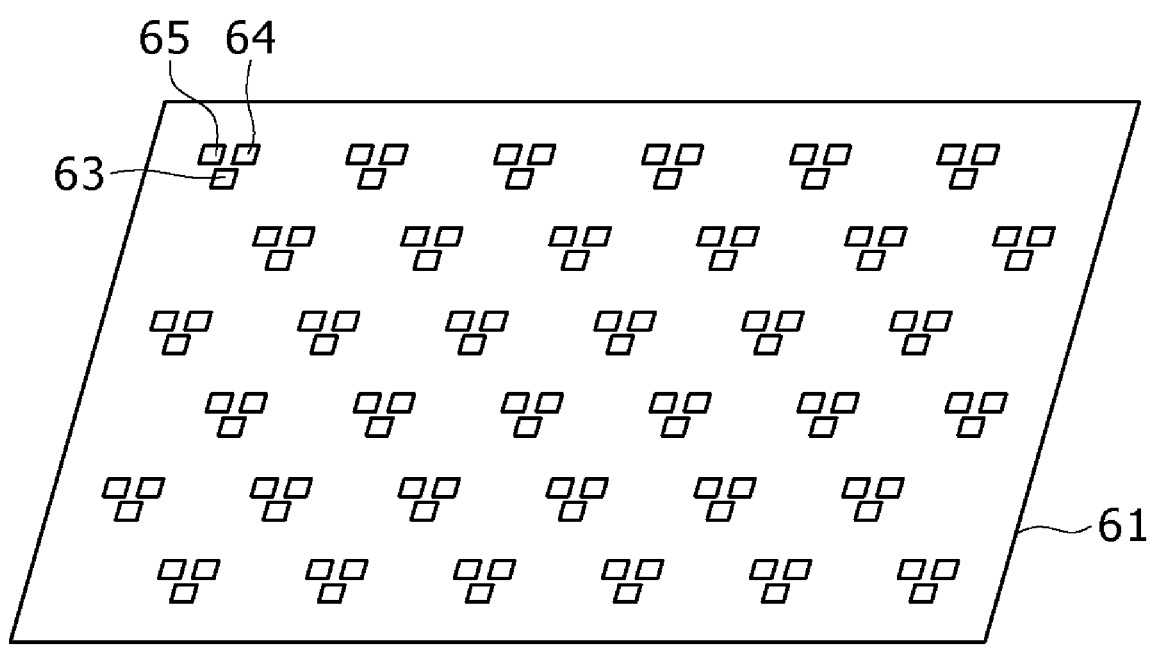
FIG. 32 is a schematic diagram illustrating the method for producing a light-emitting diode backlight according to the eighteenth embodiment of the present invention.
Figure 33:
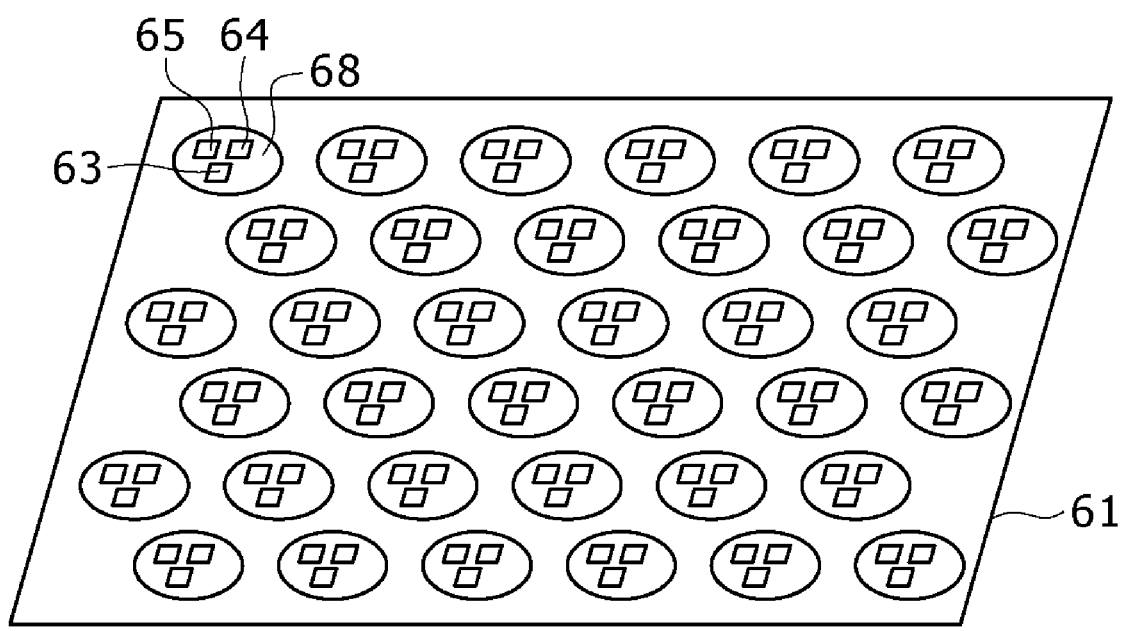
FIG. 33 is a schematic diagram illustrating the method for producing a light-emitting diode backlight according to the eighteenth embodiment of the present invention.
Figure 34:
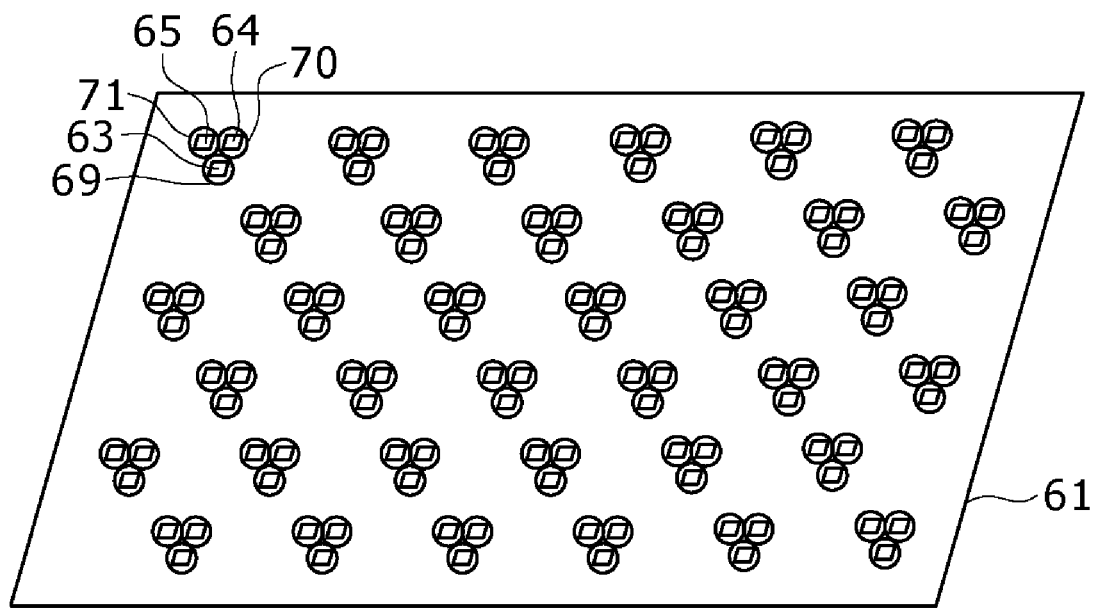
FIG. 34 is a schematic diagram illustrating the method for producing a light-emitting diode backlight according to the nineteenth embodiment of the present invention.

The red, green, and blue light-emitting diode chips 63, 64, and 65 mentioned above are combined into a unit cell, and as many unit cells as necessary for a prescribed pattern are arranged on the substrate 61, as shown in FIG. 32. Each unit cell is covered with a transparent resin 68 by potting as shown in FIG. 31B. This step is followed by curing to solidify the transparent resin 68. Curing results in slight shrinkage, as shown in FIG. 31C. In this way there is obtained the light-emitting diode backlight shown in FIG. 33, which is an array of the unit cells, each consisting of the red, green, and blue light-emitting diode chips 63, 64, and 65, arranged on the substrate 61. In this case, the transparent resin 68 is in contact with the reverse side of the sapphire substrate 11 for the green and blue light-emitting diode chips 64 and 65. Contact with the transparent resin 68 leads to a lower refractive index than contact with air. This reduces the amount of light reflected by the reverse side of the sapphire substrate 11 and increases the light emission efficiency.

The light-emitting diode backlight mentioned above will find use as the backlight of liquid crystal panel.

The following is a description of the nineteenth embodiment of the present invention.

The nineteenth embodiment is concerned with a backlight which is produced as follows in the same way as in the eighteenth embodiment. The red, green, and blue light-emitting diodes chips 63, 64, and 65 are regularly arranged on the substrate 61, and then they are covered by potting individually and respectively with transparent resins 69, 70, and 71 suitable for them. This step is followed by curing to solidify the transparent resins 69, 70, and 71. Curing results in slight shrinkage. In this way there is obtained the light-emitting diode backlight, which is an array of the unit cells, each consisting of the red, green, and blue light-emitting diode chips 63, 64, and 65, arranged on the substrate 61. In this case, the transparent resins 70 and 71 are in contact with the reverse side of the sapphire substrate 11 for the green and blue light-emitting diode chips 64 and 65. This leads to a lower refractive index than contact with air. This reduces the amount of light reflected by the reverse side of the sapphire substrate 11 and increases the light emission efficiency.

The light-emitting diode backlight mentioned above will find use as the backlight of liquid crystal panel.

The following is a description of the twentieth embodiment of the present invention.

The twentieth embodiment is concerned with a light source cell unit consisting of a blue light-emitting diode and a green light-emitting diode (both produced by the method of the sixteenth or seventeenth embodiment) in combination with a red light-emitting diode which is prepared separately.

Figure 35A:
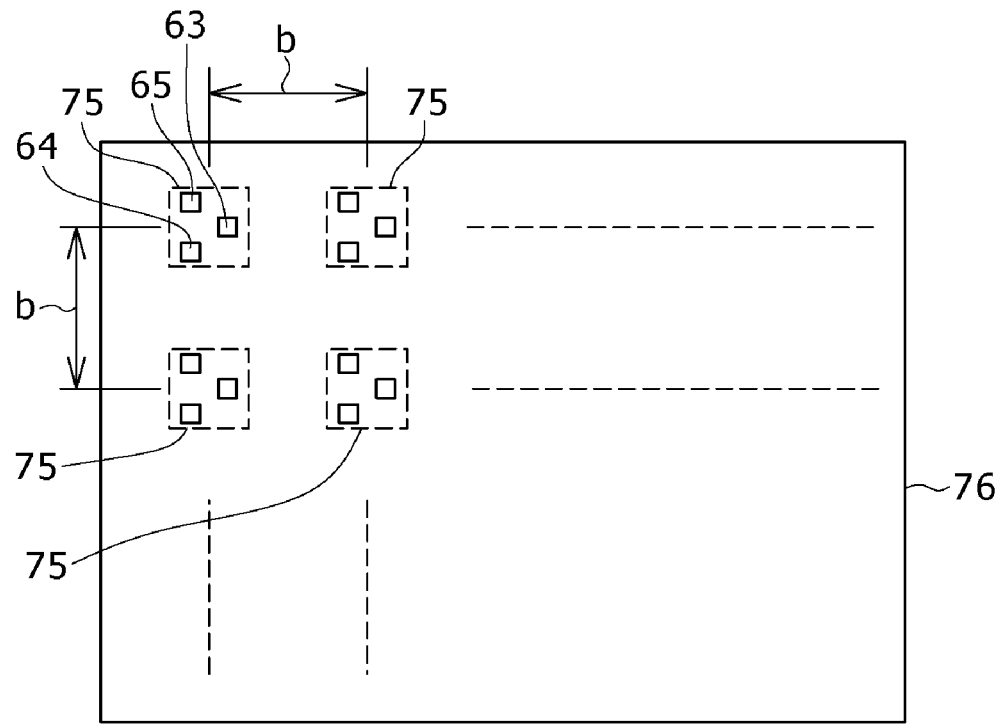
FIGS. 35A to 35B are plan views showing the light source cell unit according to the twentieth embodiment of the present invention and an enlarged view of the light source cell unit.
Figure 35B:
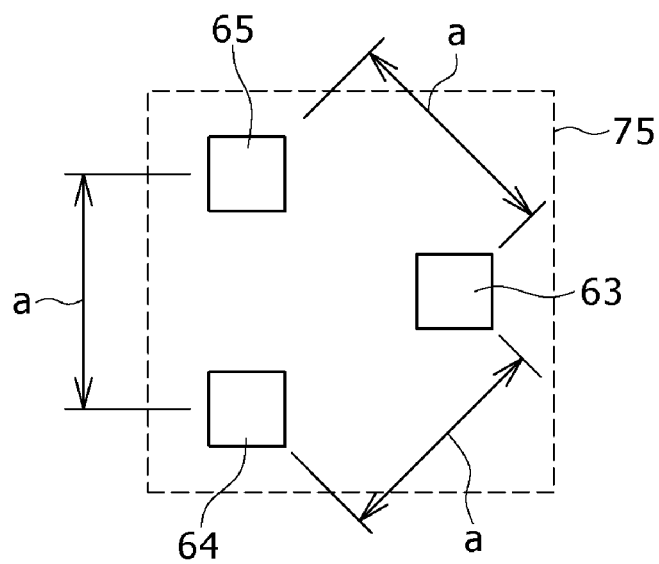

The light source cell unit 75 (shown in FIG. 35A) according to the twentieth embodiment consists of at least one each of the red light-emitting diode chip 63, the green light-emitting diode chip 64, and the blue light-emitting diode chip 65, which are regularly arranged in the same way as in the eighteenth or nineteenth embodiment. As many light source cell units 75 as necessary are regularly arranged on the printed circuit board 76. In the illustrated case, each light source cell unit 75 consists of one each of the red, green, and blue light-emitting diode chips 63, 64, and 65, which are arranged at the apexes of a triangle. FIG. 35B is an enlarged view of the cell unit 75. In each cell unit 75, the red, green, and blue light-emitting diodes chips 63, 64, and 65 are a certain distance (a) apart from one another, which is 4 mm, for example, although not restrictive. Adjacent cell units are also a certain distance (b) apart from one another, which is 30 mm, for example, although not restrictive. The printed circuit board 76 includes, for example, FR4 (Flame Retardant Type 4) board, metal core board, and flexible board. Any ones capable of heat dissipation can be used. Each unit cell 76 is covered with the transparent resin 68 by potting in the same way as the eighth embodiment. Alternatively, the red, green, and blue light-emitting diodes chips 63, 64, and 65 are covered by potting respectively with the transparent resins 69, 70, and 71, in the same way as the ninth embodiment. Thus there is obtained the light source cell unit consisting of the red, green, and blue light-emitting diodes chips 63, 64, and 65 which are arranged on the printed circuit board 76.

Figure 36:
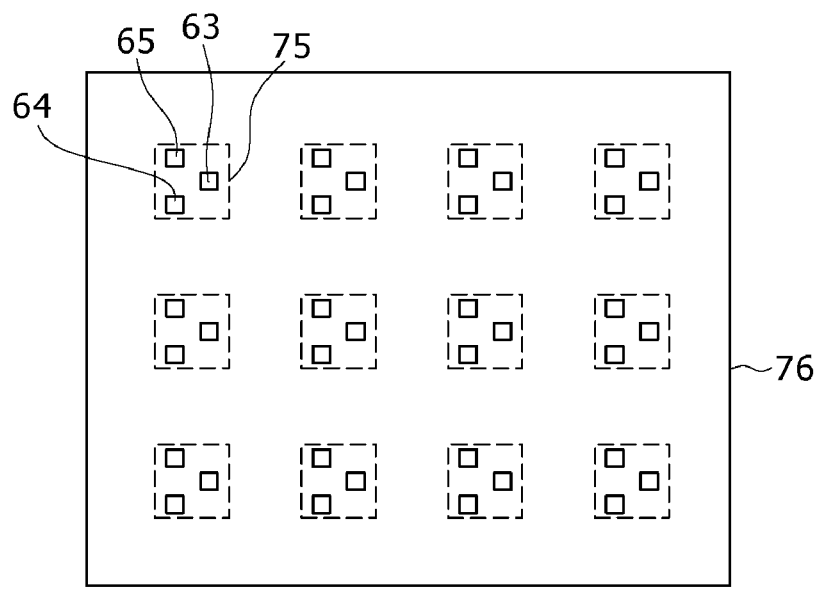
FIG. 36 is a plan view showing a typical example of the light source cell unit according to the twentieth embodiment of the present invention.
Figure 37:
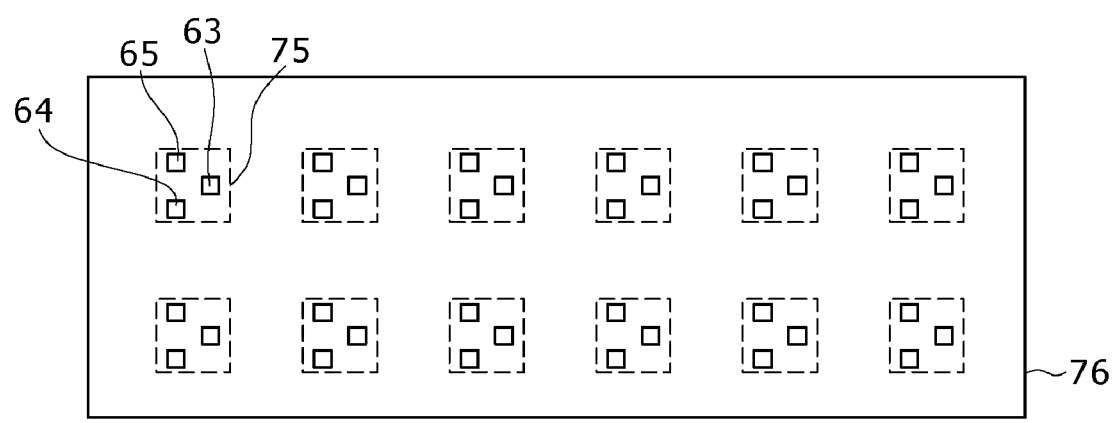
FIG. 37 is a plan view showing another typical example of the light source cell unit according to the twentieth embodiment of the present invention.

FIGS. 36 and 37 show the typical examples of the arrangement of the cell units 75 on the printed circuit board 76. The examples are not restrictive. In FIGS. 36 and 37, the unit cells 75 constitute a 4×3 two-dimensional array and a 6×2 two-dimensional array, respectively.

Figure 38:
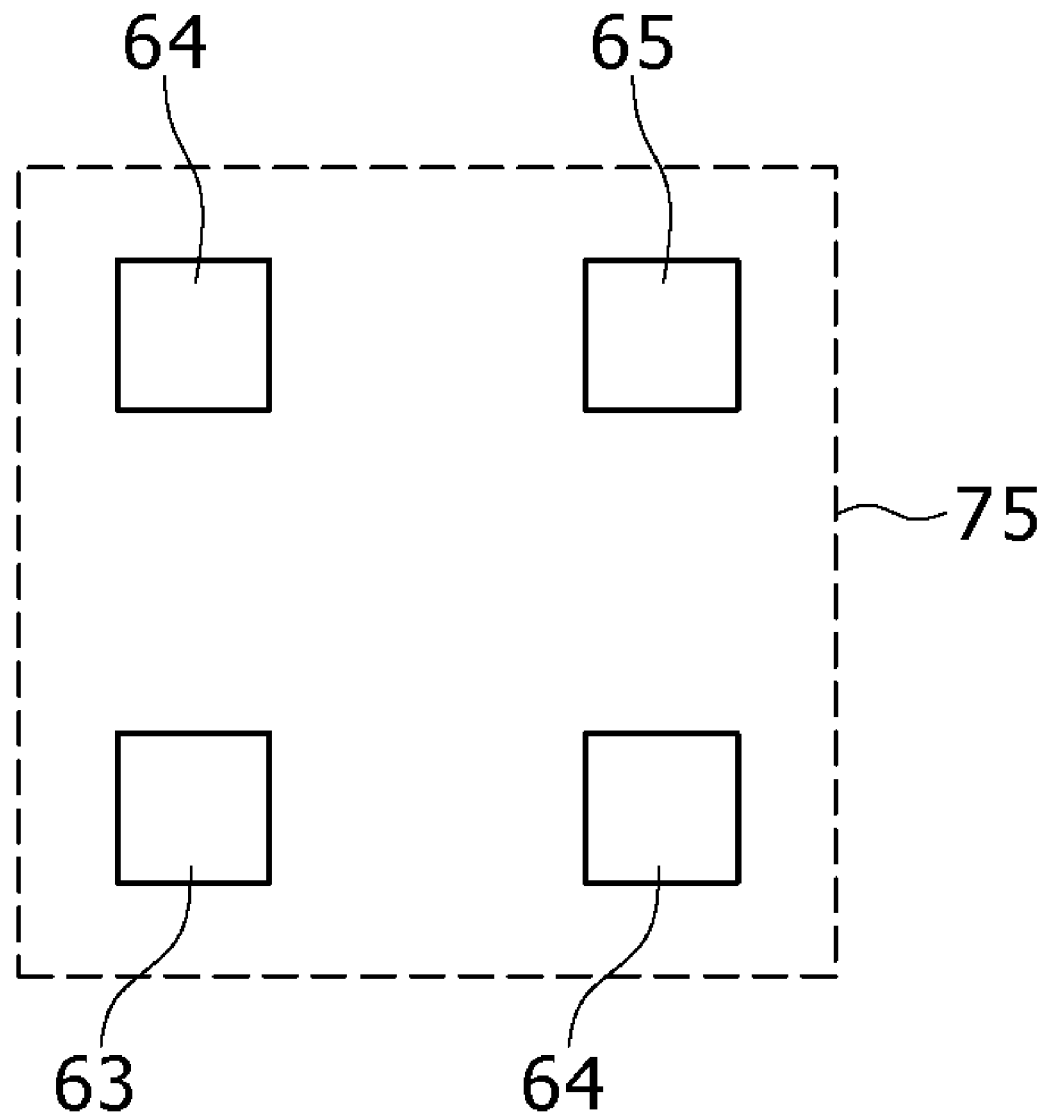
FIG. 38 is a plan view showing another example of the structure of the light source unit cell according to the twentieth embodiment of the present invention.
Figure 39:
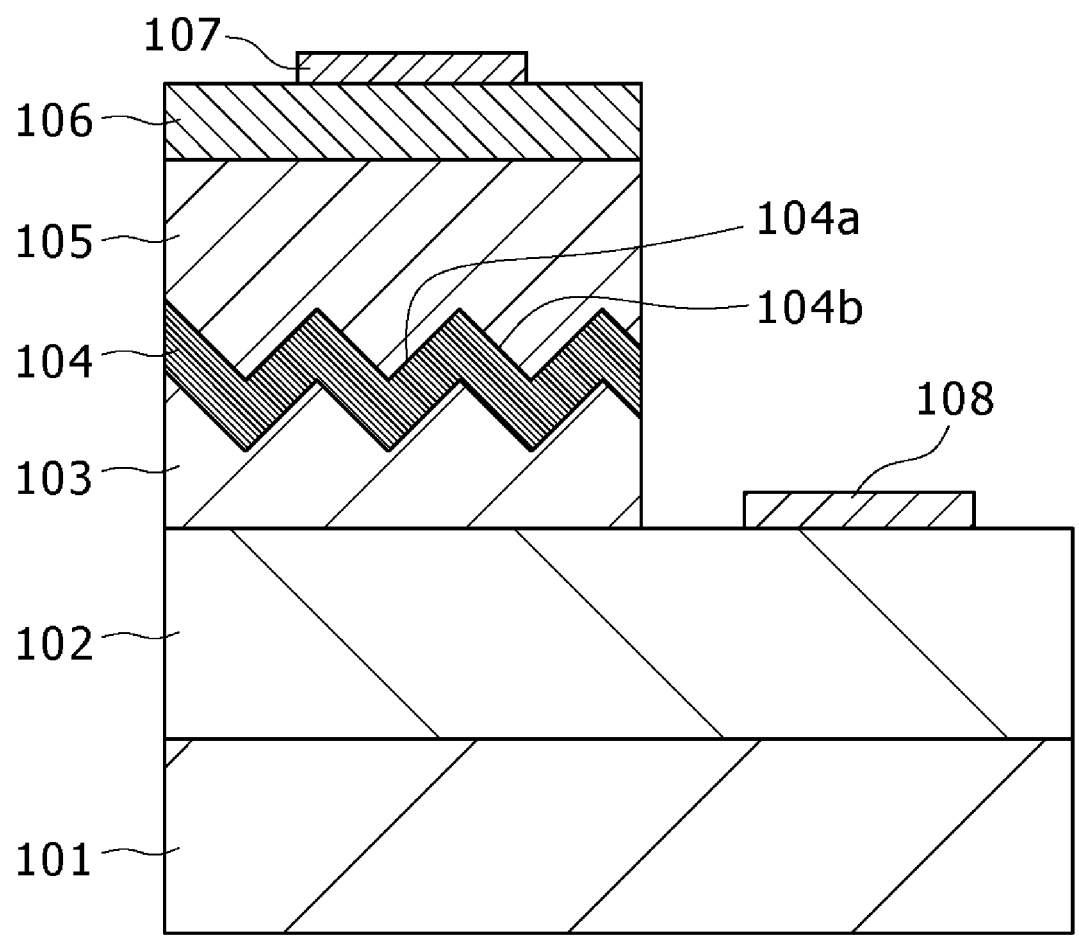
FIG. 39 is a sectional view showing the semiconductor light-emitting element proposed in Patent Document 1.

FIG. 38 shows another example of the cell unit 75, which consists of one red light-emitting diode chip 63, two green light-emitting diode chips 64, and one blue light-emitting diode chip 65, which are placed at the apexes of a square. The two green light-emitting diode chips 64 are placed at the ends of one diagonal line, and the red and blue light-emitting diode chips 63 and 65 are placed at the ends of the other diagonal line.

One or more light source cell units (which are adequately arranged) constitute a backlight consisting of light-emitting diodes, which will find use as the backlight of liquid crystal panel.

While the invention has been described above in its preferred embodiments, it is to be understood that the embodiments are not intended to restrict the scope of the invention and various changes can be made on the basis of the technical idea of the invention. If necessary, modifications may be made on the values, materials, structure, construction, shape, substrate, raw materials, and process used in the first to twentieth embodiments mentioned above.

It should be understood by those skilled in the art that various modifications, combinations, sub-combinations and alterations may occur depending on design requirements and other factor in so far as they are within the scope of the appended claims or the equivalents thereof.

What is claimed is:

1. A method for growing a semiconductor layer comprising the step of growing a semiconductor layer of hexagonal crystal structure having the (11-22) or (10-13) plane direction on the (1-100) plane of a substrate of hexagonal crystal structure, wherein, the substrate has on one principal plane thereof at least one hollow part one side of which is the (1-100) plane, and a cross section of the at least one hollow part is an inverted trapezoid.

2. The method for growing a semiconductor layer according to claim 1, wherein said semiconductor layer grows with the facets of the (11-20) plane, the (0001) plane, and the (11-22) plane facing outward.

3. The method for growing a semiconductor layer according to claim 1, wherein said semiconductor layer grows with the facets of the (1-100) plane, the (0001) plane, and the (10-13) plane facing outward.

4. The method for growing a semiconductor layer according to claim 1, wherein the semiconductor layer is formed from a semiconductor of wurtzite crystal structure.

5. The method for growing a semiconductor layer according to claim 1, wherein the semiconductor layer is formed from a III-V nitride compound semiconductor, oxide semiconductor, or oxychalcogenide.

6. The method for growing a semiconductor layer according to claim 1, wherein the substrate has the (1-100) plane as one principal plane.

7. A method for producing a semiconductor light-emitting element comprising the step of growing a semiconductor layer of hexagonal crystal structure having the (11-22) or (10-13) plane direction on the (1-100) plane of a substrate of hexagonal crystal structure, wherein, the substrate has on one principal plane thereof at least one hollow part one side of which is the (1-100) plane, and a cross section of the at least one hollow part is an inverted trapezoid.

8. A semiconductor light-emitting element comprising a substrate of hexagonal crystal structure and a semiconductor layer grown on the (1-100) plane thereof which has the (11-22) or (10-13) plane direction, wherein,
the substrate has on one principal plane thereof at least one hollow part one side of which is the (1-100) plane, and
a cross section of the at least one hollow part is an inverted trapezoid.

9. An electronic device having one or more semiconductor light-emitting elements wherein at least one of said semiconductor light-emitting elements is composed of a substrate of hexagonal crystal structure and a semiconductor layer of hexagonal crystal structure grown on the (1-100) plane thereof which has the (11-22) or (10-13) plane direction,
wherein,
the substrate has on one principal plane thereof at least one hollow part one side of which is the (1-100) plane, and
a cross section of the at least one hollow part is an inverted trapezoid.

* * * * *